US012810132B2

(12) United States Patent
Awamura et al.

(10) Patent No.: US 12,810,132 B2
(45) Date of Patent: Nov. 24, 2026

(54) COMPUTATION CIRCUIT UNIT, NEURAL NETWORK COMPUTATION CIRCUIT, AND METHOD FOR DRIVING NEURAL NETWORK COMPUTATION CIRCUIT

(71) Applicant: Nuvoton Technology Corporation Japan, Kyoto (JP)

(72) Inventors: Satoshi Awamura, Kyoto (JP); Masayoshi Nakayama, Kyoto (JP)

(73) Assignee: Nuvoton Technology Corporation Japan, Kyoto (JP)

( * ) Notice: Subject to any disclaimer, the term of this patent is extended or adjusted under 35 U.S.C. 154(b) by 168 days.

(21) Appl. No.: 18/824,477

(22) Filed: Sep. 4, 2024

(65) Prior Publication Data

US 2024/0428061 A1 Dec. 26, 2024

Related U.S. Application Data

(63) Continuation of application No. PCT/JP2023/006677, filed on Feb. 24, 2023.

(30) Foreign Application Priority Data

Mar. 11, 2022 (JP) ................................ 2022-038182

(51) Int. Cl.
*G06N 3/063* (2023.01)
*G11C 11/54* (2006.01)
*G11C 13/00* (2006.01)

(52) U.S. Cl.
CPC .............. *G06N 3/063* (2013.01); *G11C 11/54* (2013.01); *G11C 13/0028* (2013.01); *G11C 13/003* (2013.01); *G11C 2213/79* (2013.01)

(58) Field of Classification Search
CPC .. G06N 3/063; G11C 13/0028; G11C 13/003; G11C 2213/79; G11C 11/54;
(Continued)

(56) References Cited

U.S. PATENT DOCUMENTS 10,389,375 B1 8/2019 Fick et al.
11,604,974 B2 * 3/2023 Kouno ................ G11C 11/1673
(Continued)

FOREIGN PATENT DOCUMENTS

JP 2018-120433 A 8/2018
WO 2019/049741 A1 3/2019
(Continued)

OTHER PUBLICATIONS

M. Prezioso, et al., "Training and operation of an integrated neuromorphic network based on metal-oxide memristors," Nature, No. 521, pp. 61-64, 2015.
(Continued)

*Primary Examiner* — Amir Zarabian
*Assistant Examiner* — Justin Bryce Heisterkamp
(74) *Attorney, Agent, or Firm* — Rimon P.C.

(57) ABSTRACT

In a neural network computation circuit that outputs output data according to a result of a multiply-accumulate operation on input data and connection weight coefficients, a computation circuit unit that expresses one connection weight coefficient includes a plurality of selection transistors and a plurality of nonvolatile variable resistance elements. The nonvolatile variable resistance elements each express a weight coefficient with a different weight. Each of the nonvolatile variable resistance elements holds information of an upper digit of an absolute value of a positive weight coefficient, information of a lower digit of the absolute value of the positive weight coefficient, information of an upper digit of an absolute value of a negative weight coefficient, or information of a lower digit of the absolute value of the negative weight coefficient.

13 Claims, 29 Drawing Sheets

(58) Field of Classification Search
CPC ............ G11C 13/0004; G11C 13/0007; G11C 13/004; G11C 13/0069; G06G 7/16; G06G 7/163; G06G 7/60
See application file for complete search history.

(56) References Cited

U.S. PATENT DOCUMENTS

| | | | | |
|---|---|---|---|---|
| 11,615,299 | B2 * | 3/2023 | Mochida | G06F 7/5443 706/41 |
| 2018/0211154 | A1 * | 7/2018 | Mori | G06N 3/0495 |
| 2020/0202204 | A1 * | 6/2020 | Kouno | G11C 13/0004 |
| 2020/0202207 | A1 * | 6/2020 | Mochida | G06F 7/5443 |
| 2020/0342295 | A1 * | 10/2020 | Liu | G06F 7/5443 |
| 2021/0026601 | A1 | 1/2021 | Kobayashi et al. | |

FOREIGN PATENT DOCUMENTS

| | | | |
|---|---|---|---|
| WO | 2019/182730 | A1 | 9/2019 |
| WO | 2019/188457 | A1 | 10/2019 |

OTHER PUBLICATIONS

International Search Report dated Apr. 18, 2023 issued in International Patent Application No. PCT/JP2023/006677, with English translation.

* cited by examiner

| Symbol | Explanation |
| --- | --- |
| xi | Input |
| wi | Weight coefficient |
| y | Output |
| f | Activation function |

$$f(x) = \begin{cases} 0 \; if \; x \leq 0 \\ 1 \; if \; x > 0 \end{cases}$$

$$y = f(\sum_{i=0}^{n} w_i \cdot x_i)$$

(a)

(b)

| Symbol | Explanation |
|---|---|
| xi | Input (0/1) |
| Ii | ith cell current |
| I | Total current |

(c)

$$I = \sum_{i=0}^{n} I_i \cdot x_i$$

(a)

(b)

| | |
|---|---|
| Imax | 50 = Imax0 |
| Element count | 1 cell for each sign |
| Quantization bit count | 7 |
| Quantization level Q | $0 \le Q \le 127$ |
| Cell current per quantization unit | Imax / 127 |

(a)

(b) Conventional condition 1

| | |
|---|---|
| Imax | 50 = Imax0 |
| Element count | 1 cell for each sign |
| Quantization bit count | 7 |
| Quantization level Q | $0 \leq Q \leq 127$ |
| Cell current per quantization unit | Imax / 127 |

(c) Conventional condition 2

| | |
|---|---|
| Imax | Imax0 / 3 |
| Element count | 1 cell for each sign |
| Quantization bit count | 7 |
| Quantization level Q | $0 \leq Q \leq 127$ |
| Cell current per quantization unit | Imax0 / 3 / 127 |

(a)

(b)

| | |
|---|---|
| Imax | Imax0 / 3 (Imax0 = 50) |
| Element count | 2 cells for each sign |
| Quantization bit count | 4 + 4 |
| Quantization level Q | 0 ≤ QU, QL ≤ 15<br>0 ≤ Q = QU * 16 + QL ≤ 127 |
| Cell current per quantization unit | Imax0 / 15 / 3 |

FIG. 11B

| | Conventional technology | | Embodiment |
|---|---|---|---|
| Current usage condition | Conventional condition 1 | Conventional condition 2 | Conventional condition 2 / 2 elements used |
| Cell-current upper limit Imax of element (Maximum current that element can use is Imax0 = 50 μA) | Imax0 | Imax0 / 3 | Imax0 / 3 |
| Element count | 1 cell for each sign | 1 cell for each sign | 2 cells for each sign |
| Quantization bit count | 7 | 7 | 4 + 4 |
| Quantization level Q | 0 ≤ Q ≤ 127 | 0 ≤ Q ≤ 127 | When 0 ≤ QU, QL ≤ 15<br>Q = QU * 16 + QL<br>0 ≤ Q ≤ 127 |
| Cell current per quantization unit | Imax0 / 127 | Imax0 / 127 / 3 | Imax0 / 15 / 3 |
| Linearity | Deteriorated | Improved | Improved |
| Current accuracy | Reference value | Deteriorated | Unchanged or Improved |

(a)

(b)

| | |
|---|---|
| Imax | Imax0 / 3 (Imax0 = 50) |
| Element count | 1 cell for each |
| Quantization bit count in main region | 4 |
| Quantization level Q in main region | 0 ≤ Q ≤ 15 |
| Cell current per quantization unit | Iunit = Imax0 / 3 / 15 |
| Level QC that element can use in additional region | 0 ≤ QC ≤ 45 |

(c)

| Cell current | Set level value | Set current |
|---|---|---|
| IC1 | 1 | 1 × Iunit |
| IC2 | 2 | 2 × Iunit |
| IC3 | 4 | 4 × Iunit |
| IC4 | 8 | 8 × Iunit |
| IC5 | 16 | 16× Iunit |
| IC6 | 32 | 32 × Iunit |
| • • • | • • • | • • • |
| ICm | 32 | 32 × Iunit |

(a)

(b)

| Symbol | Explanation |
|---|---|
| $x_i$ | Input |
| $n$ | Input node count |
| $w_{k,i,j}$ | Connection weight coefficient for kth layer |
| $y_i$ | Final output |
| $m$ | Final output node count |
| $y_{ki}$ | Intermediate layer output of kth layer |
| $n_k$ | Node count of kth layer |
| f | Activation function |

(c)

$$y_{k+1,i} = f\left(\sum_{i=0}^{n_k} w_{k,i,j} \cdot y_{kj}\right)$$

(a)

(b)

| | |
|---|---|
| Imax | Imax0 / 3 (Imax0 = 50) |
| Element count | 3 cells for each sign |
| Quantization bit count | 3(1) + 3 + 3 |
| Quantization level Q | 0 ≤ Q1, Q2, Q3 ≤ 7<br>0 ≤ Q = Q1 * 64 + Q2 * 8 + Q3 ≤ 127 |
| Cell current per quantization unit | Imax0 / 3 / 7 |

FIG. 26

| Output of high-order readout determination circuit | Output of low-order readout determination circuit | Final output |
|---|---|---|
| Positive | Positive | Positive |
| Positive | Negative | Indeterminable |
| Negative | Positive | Indeterminable |
| Negative | Negative | Negative |

FIG. 27

| Output of high-order readout determination circuit | Output of low-order readout determination circuit | Final output |
|---|---|---|
| Positive | Positive | Positive |
| Positive | Negative | Indeterminable |
| Positive | Equal | Positive |
| Negative | Positive | Indeterminable |
| Negative | Negative | Negative |
| Negative | Equal | Negative |
| Equal | Positive | Positive |
| Equal | Negative | Negative |
| Equal | Equal | Equal |

COMPUTATION CIRCUIT UNIT, NEURAL NETWORK COMPUTATION CIRCUIT, AND METHOD FOR DRIVING NEURAL NETWORK COMPUTATION CIRCUIT

CROSS REFERENCE TO RELATED APPLICATIONS

This is a continuation application of PCT International Application No. PCT/JP2023/006677 filed on Feb. 24, 2023, designating the United States of America, which is based on and claims priority of Japanese Patent Application No. 2022-038182 filed on Mar. 11, 2022. The entire disclosures of the above-identified applications, including the specifications, drawings and claims are incorporated herein by reference in their entirety.

FIELD

The present disclosure relates to a computation circuit unit that includes nonvolatile semiconductor storage elements, a neural network computation circuit, and a method for driving the neural network computation circuit.

BACKGROUND

Along with development of information communication technology, the arrival of Internet of Things (IoT) technology with which various things are connected to the Internet has been attracting attention. With the IoT technology, performance of various electronic devices is expected to be improved by the devices being connected to the Internet, but nevertheless, as technology for achieving further improvement in performance, research and development of artificial intelligence (AI) technology that allows electronic devices to train themselves and make determinations have been actively conducted in recent years.

In the AI technology, neural network technology of technologically imitating human brain information processing has been used, and research and development have been actively conducted for semiconductor integrated circuits that perform neural network computation at high speed with low power consumption.

A neural network includes basic elements referred to as neurons (that may also be referred to as perceptrons) connected to inputs by junctions referred to as synapses and having different connection weight coefficients (that are also simply referred to as “weight coefficients” hereinafter), and can perform advanced computation processing such as image recognition and speech recognition by the neurons being connected to one another. Each neuron performs a multiply-accumulate operation to obtain a sum total of products resulting from multiplying inputs by connection weight coefficients.

Non Patent Literature (NPT) 1 discloses an example of a neural network computation circuit that includes variable resistance nonvolatile memories (that may also be simply referred to as nonvolatile variable resistance elements or simply “resistance elements” hereinafter). A neural network computation circuit is configured using a variable resistance nonvolatile memory having an analog resistance value (or stated differently, conductance). An analog resistance value corresponding to a connection weight coefficient is stored in a nonvolatile memory element. An analog voltage corresponding to an input is applied to the nonvolatile memory element, and a value of analog current flowing through the nonvolatile memory element at this time is utilized. A multiply-accumulate operation performed in a neuron is performed by storing connection weight coefficients in nonvolatile memory elements as analog resistance values, applying analog voltages having values corresponding to inputs to the nonvolatile memory elements, and obtaining, as a result of the multiply-accumulate operation, an analog current value that is a sum of current values of current flowing through the nonvolatile memory elements. A neural network computation circuit that includes such nonvolatile memory elements can reduce power consumption, and process development, device development, and circuit development have been actively conducted in recent years for variable resistance nonvolatile memories having settable analog resistance values.

Patent Literature (PTL) 1 and PLT 2 each disclose a neural network computation circuit that stores therein an analog resistance value as a weight coefficient of a neural network. In these literatures, each weight coefficient is obtained by a set that includes an analog resistance element and a selection transistor. An input vector for a neural network computation circuit is a vector that includes 0 and 1, and word lines corresponding to the components of the vector are each selected in the case of input 1 and is non-selected in the case of input 0, and an input voltage is applied to a gate terminal of the selection transistor. By adding up, on the same data line, current flowing according to analog resistance values corresponding to weight coefficients in a state in which a plurality of word lines in correspondence with input 1 are selected, the total current is obtained as the result of a multiply-accumulate operation. In PTL 2, a ferroelectric-gate field-effect transistor (FeFET) and a fixed resistor are used for the selection transistor, so that space is saved. In PTL 3, a weight coefficient is a programmable current source, but the principle as a multiply-accumulate operation circuit is similar to those in PTL 1 and PTL 2.

When a conventional neural network computation circuit is configured using a calculator that includes a logical circuit including complementary metal-oxide-semiconductor field-effect transistors (CMOSFETs) and is configured of using, for instance, a central processing unit (CPU), there is a load due to a transfer of a weight coefficient from a memory region that holds the weight coefficient, which is known as a Von Neumann bottleneck, and addition operation that is to be performed for multiply-accumulate operation calculation is to be successively performed. The neural network computation circuit typified by PTL 1 stated above has a configuration in which a computation circuit holds a weight coefficient by using a nonvolatile memory element, and a circuit configuration that allows a multiply-accumulate operation to be performed by adding up analog current. With those configurations, such a neural network computation circuit is to address an issue of an increase in time for calculation due to transferring a weight coefficient and successive addition, and to perform neural network computation at higher speed.

CITATION LIST

Non Patent Literature

NPL 1: M. Prezioso, et al., “Training and operation of an integrated neuromorphic network based on metal-oxide memristors,” Nature, no. 521, pp. 61-64, 2015.

Patent Literature

PTL 1: International Publication No. WO2019/049741
PTL 2: International Publication No. WO2019/188457
PTL 3: International Publication No. WO2019/182730

SUMMARY

Technical Problem

In these neural network computation circuits, addition operation in a multiply-accumulate operation is substituted by obtaining current corresponding to a computation result by adding up current flowing through resistance elements corresponding to weight coefficients on a single data line as parallel current. In order to describe issues that the present disclosure is to address, a typical configuration of such neural network computation circuits is to be described.

A relation between a neural network and total current is to be described with reference to FIG. 2 and FIG. 3.

FIG. 2 is a drawing for explaining a calculation model of a neuron included in a neural network. More specifically, (a) of FIG. 2 illustrates a calculation model of a neuron, (b) of FIG. 2 illustrates meanings of symbols shown in (a) of FIG. 2, (c) of FIG. 2 is a graph showing an example of activation function f included in the neuron, and (d) of FIG. 2 illustrates equations for explaining activation function f and output y. Products resulting from multiplying numerical value vectors w=(w1, w2, . . . , wn) referred to as weight coefficients by input vector x=(x1, x2, . . . , xn) that has one or more components are added up (or stated differently, an inner product is obtained), and thereafter activation function f is performed on the result to obtain final output y. The bottleneck of an amount of calculation in a neural network is mostly due to computation of this portion, and an operation of obtaining an inner product between vectors in a previous stage in which activation function f is performed is referred to as a multiply-accumulate operation. A neural network computation circuit that uses total current, which is typified by Patent Literature (PTL) 1, performs calculation using current flowing through a circuit to substitute the multiply-accumulate operation.

FIG. 3 is a diagram for explaining a typical circuit configuration for performing a multiply-accumulate operation. More specifically, (a) of FIG. 3 illustrates a typical circuit configuration for performing a multiply-accumulate operation, (b) of FIG. 3 illustrates meanings of symbols shown in (a) of FIG. 3, and (c) of FIG. 3 illustrates an equation for explaining total current I. To simplify the description, the case where an input vector is binarized is used. Input vector x=(x1, x2, . . . , xn) corresponds to selection and non-selection of word lines WL1, WL2, . . . , WLn. Selection transistors T1, T2, . . . , Tn and resistance elements R1, R2, . . . , Rn are connected in correspondence with weight coefficients w=(w1, w2, . . . , wn). Pairs of selection transistors Tk and resistance elements Rk each form one cell and in particular, cell current I1, I2, . . . , In of current flowing through the cells expresses products of weight coefficients and corresponding input vectors. With this configuration, by grounding source line SL (Vss) and applying a voltage (Vdd) to bit line BL, current flows through a cell selected by an input vector in response to the input to word line WL. Total current of all selected cells flows through bit line BL according to the Kirchhoff's current law. The total current expresses a multiply-accumulate operation in the calculation model in FIG. 2.

In the calculation model of the neural network illustrated in FIG. 2, a weight coefficient is calculated using a real number with a sign. Final output can be obtained by performing activation function f on the value resulting from the multiply-accumulate operation. A typical configuration for circuit realization of these is to be described with reference to FIG. 4. FIG. 4 is a diagram for explaining a configuration that includes a multiply-accumulate operation circuit that uses total current and a determination circuit. More specifically, (a) of FIG. 4 illustrates a circuit that includes a multiply-accumulate operation circuit and determination circuit C, and (b) of FIG. 4 illustrates meanings of symbols shown in (a) of FIG. 4, and (c) of FIG. 4 shows equations for explaining total current IP corresponding to the result of a multiply-accumulate operation on positive weight coefficients, total current IN corresponding to the result of a multiply-accumulate operation on negative weight coefficients, and output Y of determination circuit C.

In FIG. 4, a system is configured to perform computation for each of positive and negative weight coefficients to express a real number with a sign, by using two multiply-accumulate operation circuit configurations in FIG. 3. Thus, two cells are connected to one word line WL, a resistance value is set to one of the cells to cause cell current corresponding to an absolute value of the weight coefficient to flow through the cell, in correspondence with a positive or negative weight coefficient that is to be expressed, and a sufficiently high resistance value is set to the other cell to reduce current equivalent to current corresponding to the current that flows in a non-selected state. Stated differently, two cells are used to express one weight coefficient. Selection transistors TP1, . . . , TPn and resistance elements RP1, . . . , RPn in FIG. 4 are used to achieve cell current expression based on a weight coefficient corresponding to a positive value, whereas selection transistors TN1, . . . , TNn and resistance elements RN1, . . . , RNn are used to achieve cell current expression based on a weight coefficient corresponding to a negative value. With such a configuration, total current IP corresponding to the result of a multiply-accumulate operation on positive weight coefficients and total current IN corresponding to the result of a multiply-accumulate operation on negative weight coefficients flow through bit lines BLP and BLN, respectively, by grounding source lines SLP and SLN (Vss) and applying the same voltage to bit lines BLP and BLN (Vdd), according to the operation principle in FIG. 3.

To simplify a description, considering an example in which the activation function is a step function shown in FIG. 2, that is, a function that outputs 1 or 0 according to whether input is positive or negative, the activation function corresponds to comparing magnitude between total current IP and total current IN in the circuit in FIG. 4. Determination circuit C that achieves this can be readily embodied using, for example, a current differential sense amplifier that is a known technique. Note that connection between the multiply-accumulate operation circuit and determination circuit C is a logical connection, and a signal corresponding to total current IP flowing through bit line BLP and a signal corresponding to total current IN flowing through bit line BLN are input to determination circuit C. A signal corresponding to total current IP flowing through source line SLP instead of total current IP flowing through bit line BLP and a signal corresponding to total current IN flowing through source line SLP instead of total current IN flowing through bit line BLN may be input to determination circuit C.

Note that operation of binarizing input and output to 0 and 1 has been described herein in order to simplify the description, yet a configuration, for instance, is conceivable which further enhances expression accuracy of circuit realization analogy with a neural network computation model by providing analog-digital (AD) conversion and digital-analog (DA) conversion circuits. As examples, the accuracy of an activation function is increased by setting the input level of word line WL to an intermediate level between 0 and 1, by causing a comparing circuit for total current IP and total current IN to make analog comparison, or by setting output according to a comparison level. But nevertheless, these are techniques that can be analogized from the above description, and thus description of the techniques is omitted.

An issue that relates to a usable current range (a dynamic range) for each resistance element, which is an issue when realizing such a circuit for a multiply-accumulate operation using total current, is to be described below.

As a factor that affects computation accuracy when realizing such a neural network computation circuit by using a method of adding up a plurality of currents at one time, an allowable current amount of current flowing through each bit line is to be described with reference to FIG. 5. FIG. 5 is a circuit diagram illustrating an example of a transistor circuit that is normally included in a multiply-accumulate operation circuit that uses total current. When a neural network computation circuit is to be configured, power supply (Vdd) connected to bit line BL and ground (Vss) connected to source line SL in FIG. 3 are connected via bit-line selection switch SWBL and source-line selection switch SWSL that serve as switches and SL grounding transistor TDSL and BL-Vdd connection transistor TDBL that are drive circuits, as illustrated in FIG. 5. Thus, when a circuit is actually configured, total current is clamped based on allowable current amounts of the transistors connected in series to a path from a power supply (Vdd) to the ground (Vss). In order to increase an allowable current amount, transistor performance of a selection transistor that serves as a switch and a drive circuit is to be increased, yet this also results in an increase in transistor size and circuit scale. When these neural network computation circuits are formed on a silicon substrate by microprocessing, allowable current densities of wires such as bit line BL and source line SL are determined by physical properties of conductors included in the wires, and thus an allowable current amount of such bit line BL is to be taken into consideration in designing circuits.

While the upper limit of total current is restricted by their allowable current amounts, an issue that arises in reducing current flowing through each cell and expressing a weight coefficient is to be described next.

A weight coefficient of a neural network as a mathematical model takes on a real number. Thus, in order to associate current flowing through a resistance element with a weight coefficient, a current range of the resistance element and a current range that the weight coefficient may cover are to be associated with each other. FIG. 6 is a graph showing a relation between an ideal weight coefficient and cell current. In FIG. 6, the weight coefficient represented by the horizontal axis is assumed to be normalized based on the maximum value of absolute values, whereas the cell current represented by the vertical axis can be variably set from cell-current lower limit Imin that is the minimum value to cell-current upper limit Imax that is the maximum value. At this time, when an absolute value of a weight coefficient is w, current Iw corresponding to weight coefficient w is used as illustrated in FIG. 6. Note that cell-current lower limit Imin and cell-current upper limit Imax are the minimum value and the maximum value of cell current based on the settings.

In a neural network computation circuit, two cells represent one real number with a sign. FIG. 7 illustrates current values (IP1, IN1) of two cells when weight coefficient w with a sign is expressed using the two cells. Thus, FIG. 7 shows the case where w>0 is considered. Accordingly, current Iw is set to flow through cell CellP on the positive side and current having cell-current lower limit Imin is set to flow through cell CellN on the negative side. By making such settings, identical cell-current lower limit Imin is added for bit line BLP on the positive side and bit line BLN on the negative side after current is added up, and thus is cancelled out when compared.

Accordingly, total current I is determined by the relation $$I=(I\text{max}-I\text{min})\times w+I\text{min}$$

and thus by determining the value of I according to weight coefficient w, weight coefficient w that takes on a value of at least 0 and at most 1 can be associated with a value of at least cell-current lower limit Imin and at most cell-current upper limit Imax, and thus linearity of a multiply-accumulate operation can be theoretically maintained by the association. However, as described above, as adding up current flowing through a plurality of cells, current is not unlimitedly increased, and is clamped at a certain current level. From the viewpoint of linearity of computation, when such a clamp phenomenon is considered, this can be rephrased as an issue of deterioration of linearity due to current being clamped.

On the other hand, to decrease cell-current upper limit Imax is to be considered in order to assure the linearity with regard to adding up current. As described above, cell-current lower limit Imin is cancelled out in computation, and thus it is possible to consider Imin=0(A), to simplify the description. In order to express a real number of at least 0 and at most 1, to decrease cell-current upper limit Imax requires higher accuracy for the controllability of cell current. This leads to an issue of being prone to be affected by manufacturing variations, in particular when actual products are manufactured especially in large quantities.

From the above description, with regard to a cell current amount, a conventional neural network computation circuit have an issue of an allowable current amount of a bit line through which total current flows and an antinomic issue of maintaining current accuracy in reducing current.

The present disclosure is to address the above conventional issues, and is to provide a computation circuit unit, a neural network computation circuit, and a method for driving the neural network computation circuit, which achieve both of maintaining current accuracy and reduction in total current.

Solution to Problem

In order to provide such a computation circuit unit, a computation circuit unit according to an aspect of the present disclosure is a computation circuit unit that holds a weight coefficient having a positive value or a negative value and corresponding to input data that selectively takes on a first logical value or a second logical value, and provides current corresponding to a product of the input data and the weight coefficient, the computation circuit unit including: a word line; a first data line; a second data line; a third data line; a fourth data line; a fifth data line; a sixth data line; a seventh data line; an eighth data line; first nonvolatile semiconductor storage element; a second nonvolatile semiconductor storage element; a third nonvolatile semiconductor storage element; a fourth nonvolatile semiconductor storage element; a first selection transistor; a second selection transistor; a third selection transistor; and a fourth selection transistor. A gate of the first selection transistor, a gate of the second selection transistor, a gate of the third selection transistor, and a gate of the fourth selection transistor are connected to the word line, one terminal of the first nonvolatile semiconductor storage element and a drain terminal of the first selection transistor are connected, one terminal of the second nonvolatile semiconductor storage element and a drain terminal of the second selection transistor are connected, one terminal of the third nonvolatile semiconductor storage element and a drain terminal of the third selection transistor are connected, one terminal of the fourth nonvolatile semiconductor storage element and a drain terminal of the fourth selection transistor are connected, the first data line and a source terminal of the first selection transistor are connected, the third data line and a source terminal of the second selection transistor are connected, the fifth data line and a source terminal of the third selection transistor are connected, the seventh data line and a source terminal of the fourth selection transistor are connected, the second data line and an other terminal of the first nonvolatile semiconductor storage element are connected, the fourth data line and an other terminal of the second nonvolatile semiconductor storage element are connected, the sixth data line and an other terminal of the third nonvolatile semiconductor storage element are connected, the eighth data line and an other terminal of the fourth nonvolatile semiconductor storage element are connected, the first nonvolatile semiconductor storage element holds, as a resistance value, information of a positive weight coefficient with a weight different from a weight for the second nonvolatile semiconductor storage element, the third nonvolatile semiconductor storage element holds, as a resistance value, information of a negative weight coefficient with a weight different from a weight for the fourth nonvolatile semiconductor storage element, and by the first data line, the third data line, the fifth data line, and the seventh data line being grounded and the second data line, the fourth data line, the sixth data line, and the eighth data line each being applied with a voltage, the computation circuit unit provides, based on current flowing through the second data line, the fourth data line, the sixth data line, and the eighth data line, (i) current corresponding to the product obtained from the input data having the first logical value when the word line is non-selected, and (ii) current corresponding to the product obtained from the input data having the second logical value when the word line is selected.

In order to provide such a neural network computation circuit, a neural network computation circuit according to an aspect of the present disclosure is a neural network computation circuit including: a main region that includes a plurality of computation circuit units each of which is the computation circuit unit; a first additional region, a second additional region, a third additional region, and a fourth additional region each of which includes a selection transistor and a nonvolatile semiconductor storage element having a structure identical to a structure of the first to fourth nonvolatile semiconductor storage elements included in each of the plurality of computation circuit units; a first control circuit for selecting a word line to be connected to a gate of the selection transistor included in the first additional region; a second control circuit for selecting a word line to be connected to a gate of the selection transistor included in the second additional region; a third control circuit for selecting a word line to be connected to a gate of the selection transistor included in the third additional region; a fourth control circuit for selecting a word line to be connected to a gate of the selection transistor included in the fourth additional region; a first node; a second node; a third node; a fourth node; a fifth node; a sixth node; a seventh node; an eighth node; a first determination circuit; and a second determination circuit. The first data line included in each of the plurality of computation circuit units in the main region is connected to the first node, the second data line included in each of the plurality of computation circuit units in the main region is connected to the second node, the third data line included in each of the plurality of computation circuit units in the main region is connected to the third node, the fourth data line included in each of the plurality of computation circuit units in the main region is connected to the fourth node, the fifth data line included in each of the plurality of computation circuit units in the main region is connected to the fifth node, the sixth data line included in each of the plurality of computation circuit units in the main region is connected to the sixth node, the seventh data line included in each of the plurality of computation circuit units in the main region is connected to the seventh node, the eighth data line included in each of the plurality of computation circuit units in the main region is connected to the eighth node, the first determination circuit is connected to the second node and the sixth node, the second determination circuit is connected to the fourth node and the eighth node, the first control circuit is connected to a word line in the first additional region, the second control circuit is connected to a word line in the second additional region, the third control circuit is connected to a word line in the third additional region, the fourth control circuit is connected to a word line in the fourth additional region, each of a plurality of word lines in the main region receives input of corresponding binary data, by the third node and the seventh node being grounded and the fourth node and the eighth node each being applied with a voltage, the neural network computation circuit determines, based on current flowing through the fourth node and the eighth node, a low-order computation result by controlling the first control circuit, the third control circuit, and the second determination circuit, and the neural network computation circuit: determines control of the second control circuit and the fourth control circuit, based on the low-order computation result; and outputs, using the first determination circuit, a computation result corresponding to a sum of products, by the first node and the fifth node being grounded and the second node and the sixth node each being applied with a voltage, the products being obtained by the plurality of computation circuit units.

In order to provide such a method, a method for driving a neural network computation circuit according to an aspect of the present disclosure is a method for driving a neural network computation circuit, the method including: normalizing absolute values of weight coefficients of a plurality of computation circuit units included in the neural network computation circuit, by dividing the absolute values by a maximum value of the weight coefficients; quantizing, based on a bit count, each of the weight coefficients normalized; separating quantized information into one or more high-order bits and one or more low-order bits; and determining, according to the one or more high-order bits and the one or more low-order bits into which the quantized information is separated, a current amount of current flowing through a nonvolatile semiconductor storage element corresponding to a high-order bit among the one or more high-order bits and a current amount of current flowing through a nonvolatile semiconductor storage element corresponding to a low-order bit among the one or more low-order bits, the nonvolatile semiconductor storage element corresponding to the high-order bit and the nonvolatile semiconductor storage element corresponding to the low-order bit being included in each of the plurality of computation circuit units.

Advantageous Effects

According to the computation circuit unit, the neural network computation circuit, and the method for driving the neural network computation circuit according to the present disclosure, antinomic issues of reducing current and maintaining accuracy in a current use range with a conventional technique can be addressed, and a neural network computation circuit that includes nonvolatile semiconductor storage elements that can achieve reduction in power consumption and large-scale integration can be provided.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 11B illustrates a comparison between conventional technology and an embodiment with regard to setting conditions and features of cells.

FIG. 26 illustrates a table showing output determinability in simultaneous readout from a high-order cell and a low-order cell, according to Embodiment 4.

FIG. 27 illustrates a table showing output determinability in simultaneous readout from a high-order cell and a low-order cell, according to Embodiment 4.

DESCRIPTION OF EMBODIMENTS

Hereinafter, embodiments of the present disclosure are to be described with reference to the drawings.

Basic Data of the Present Disclosure

First, experimental data on a typical configuration of a neural network computation circuit on which the present disclosure is based is to be described.

Figure 8A:
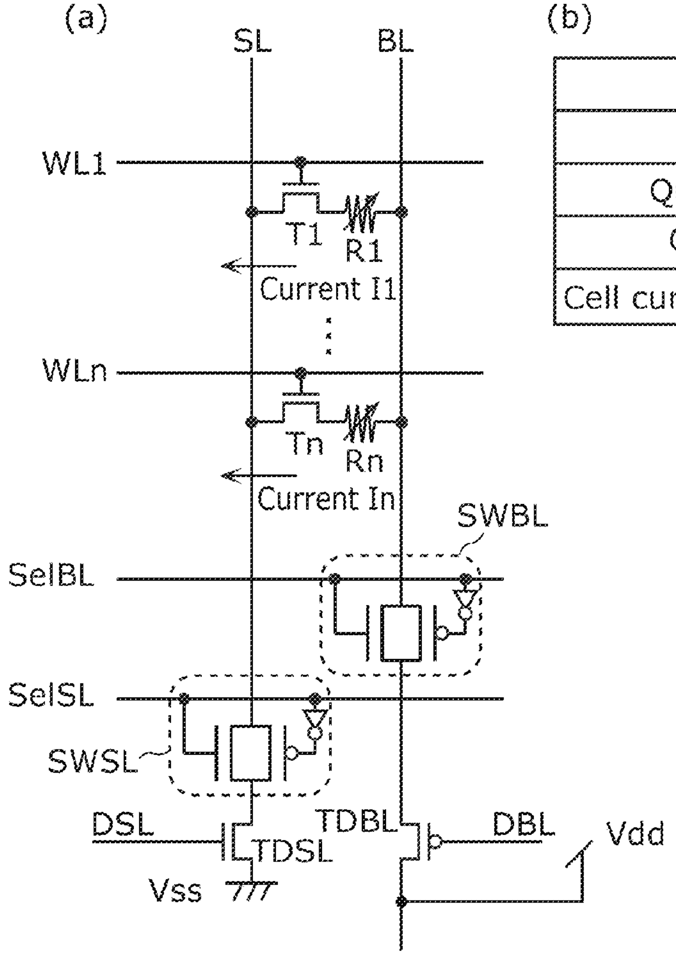
FIG. 8A Prior Art
FIG. 8A illustrates a configuration of a conventional neural network computation circuit that uses total current.
Figure 8B:
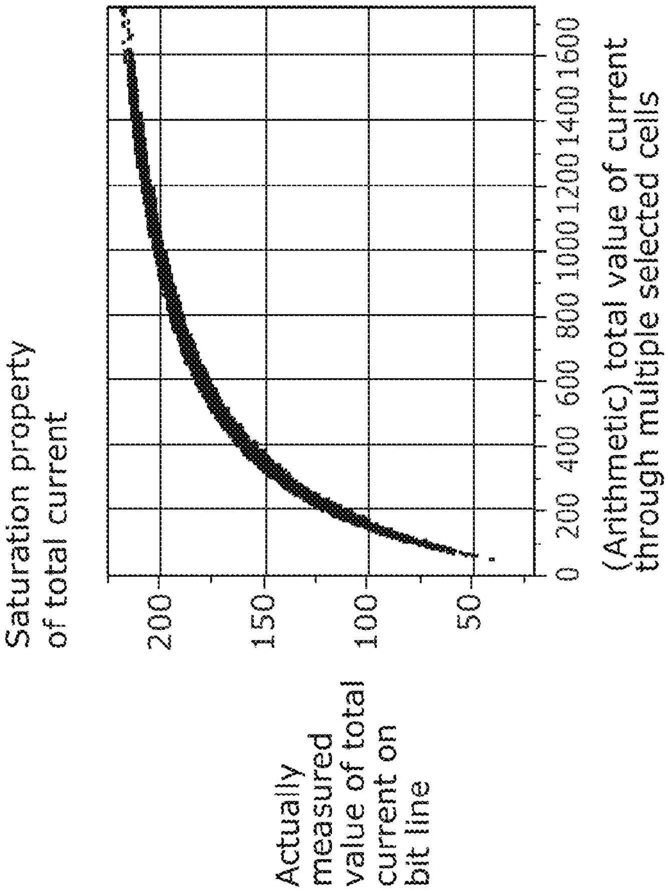
FIG. 8B illustrates data showing a relation between an arithmetic total value of cell current and total current actually measured in FIG. 8A.

FIG. 8A is a drawing for explaining a configuration of a conventional neural network computation circuit. More specifically, (a) of FIG. 8A illustrates a configuration of a conventional neural network computation circuit, and (b) of FIG. 8A illustrates setting conditions in the configuration in (a) of FIG. 8A. FIG. 8B illustrates data showing a relation between an arithmetic total value of cell current and total current actually measured in the configuration in FIG. 8A. Thus, FIG. 8B illustrates a relation between an arithmetic total of cell current through cells selected for various inputs and total current that actually flows through bit line BL, while various currents are set for cells.

As can be seen from the graph illustrated in FIG. 8B, as an arithmetic total value of cell current through target cells that are to be added up increases, an amount of increase in total current on a bit line becomes moderate and saturated. This saturation property is caused by current being clamped due to current properties of bit-line selection switch SWBL and source-line selection switch SWSL that select bit line BL and source line SL, and SL ground transistor TDSL that is a drive transistor used to make connection to the ground (Vss) and BL-Vdd connection transistor TDBL that is a drive transistor used to make connection to the power supply (Vdd). In this manner, a property of current being clamped at an allowable current amount of a bit line as total current increases is formulated as an issue of deterioration of linearity of computation from the viewpoint of a multiply-accumulate operation. Settable cell-current upper limit Imax0 that is maximum current of cell current at this time is 50 μA. Imax0 defines a dynamic range that a memory cell originally has, or stated differently, a maximum value of a realistic cell current (settable cell-current upper limit). Thus, in the conventional neural network computation circuit illustrated in (a) of FIG. 8A, settable cell-current upper limit Imax0 is 50 μA, and an element count of nonvolatile variable resistance elements is one cell for each sign, and the quantization bit count is 7, as illustrated in (b) of FIG. 8A. Thus, quantization level Q is $0 \leq Q \leq 127$, and cell current per quantization unit is Imax/127.

Figure 9:
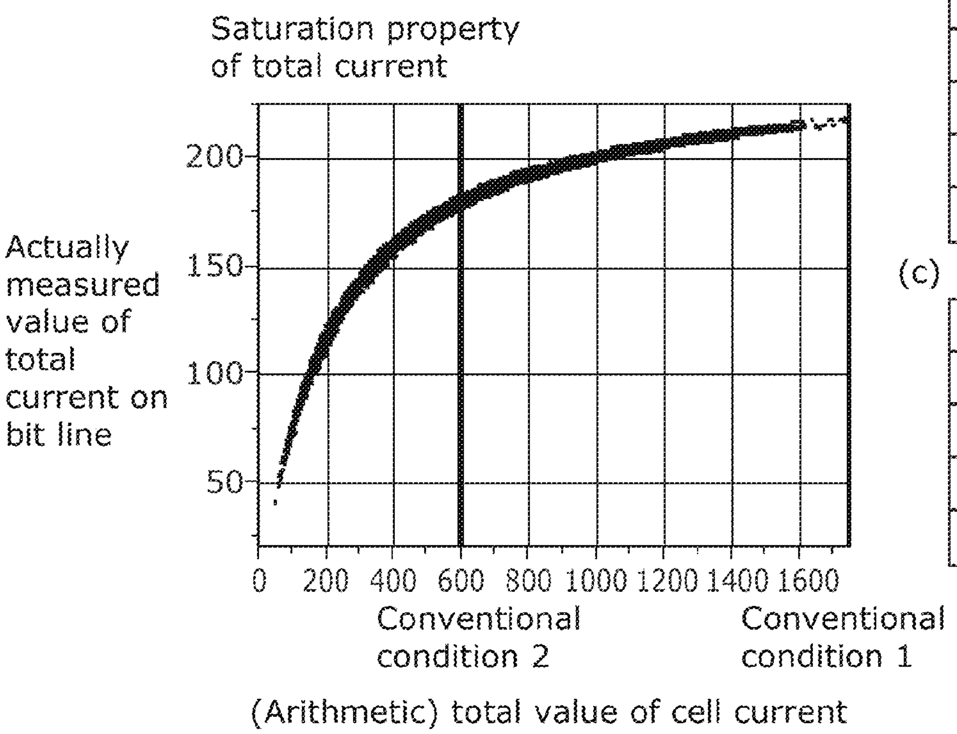
FIG. 9 is a diagram for explaining the case where the maximum current of cell current is decreased.

In view of this issue, a property when the maximum current of cell current is decreased is shown. FIG. 9 is a diagram for explaining the case where the maximum current of cell current is decreased. More specifically, (a) of FIG. 9 illustrates a current band under conventional condition 1 ((b) of FIG. 9) that is the same as (b) of FIG. 8A and conventional condition 2 ((c) of FIG. 9) when cell current is reduced to one third, in a multiply-accumulate operation circuit having the same configuration as (a) of FIG. 8A. As a result, total current assumed to flow under conventional condition 2 is considered to be usable in a region having improved linearity by entirely reducing the amount of current as illustrated in the graph in (a) of FIG. 9. On the other hand, there is an issue from the viewpoint of current controllability, which is to be described next.

A weight coefficient of a neural network has an analog real number of at least 0 and at most 1 as a mathematical model. Yet, on a neural network computation circuit, the weight coefficients are grouped at discrete levels by appropriate quantization from the viewpoint of convenience. In this data, an absolute value is expressed using seven bits and one bit is used as a sign bit, so that a weight coefficient is expressed as an integer with a sign by using eight bits. Thus, the quantization level count (the number of quantization levels) is 127, and current resulting from dividing cell-current upper limit Imax by 127 is cell current per quantization unit (refer to (b) of FIG. 9).

Figure 10:
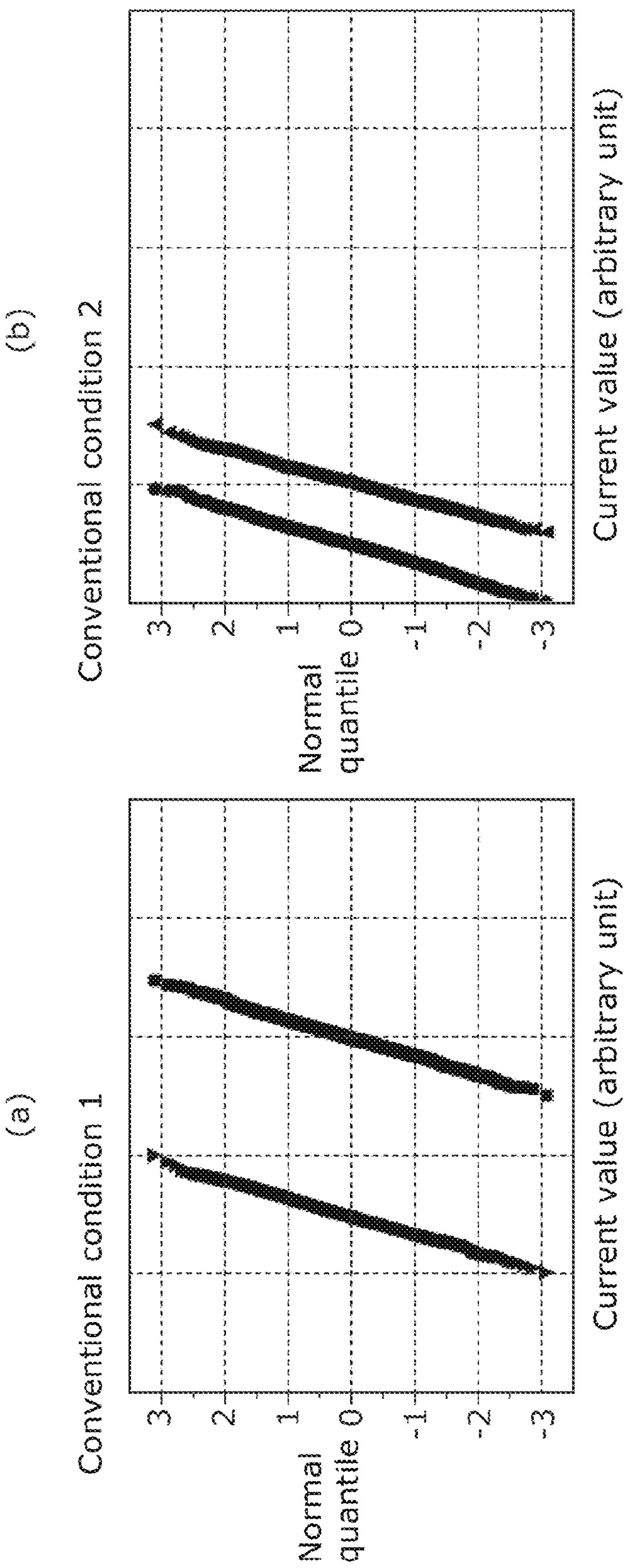
FIG. 10 illustrates graphs showing simulations of overlap of distributions at different quantization levels under conventional condition 1 and conventional condition 2 in FIG. 9.

An optimal quantization bit count varies depending on the accuracy that a multiply-accumulate operation is to have. Yet, from the viewpoint of operation stability as a neural network computation circuit, a variation in cell current that belongs to a quantization level is to be separate from a variation in cell current that belongs to a different quantization level. Various factors can be considered to cause a variation in cell current, such as a property of a nonvolatile variable resistance element, circuit accuracy for writing current, and a variation in voltage Vth of a selection transistor. Yet, as shown by conventional condition 2 shown in (c) of FIG. 9, when a circuit operates in a region in which entire cell-current upper limit Imax is simply reduced, greater influence is exerted by such variations. FIG. 10 illustrates distributions of cell current that belongs to two levels are generated by simulation. The horizontal axis represents current values, whereas the vertical axis represents normally distributed points (deviations from an average value). More specifically, (a) and (b) of FIG. 10 are graphs showing results obtained by simulating overlap of distributions at different quantization levels under conventional condition 1 and conventional condition 2, respectively. Although the simulations are simple, it can be readily understood that uniform decrease of cell-current upper limit Imax in a state in which variations are constant makes it more difficult to separate distributions ((b) of FIG. 10).

In order to address such issues, embodiments of the present disclosure in which the maximum cell current is decreased while cell current per quantization unit is ensured are to be described next.

Embodiment 1

Figure 11A:
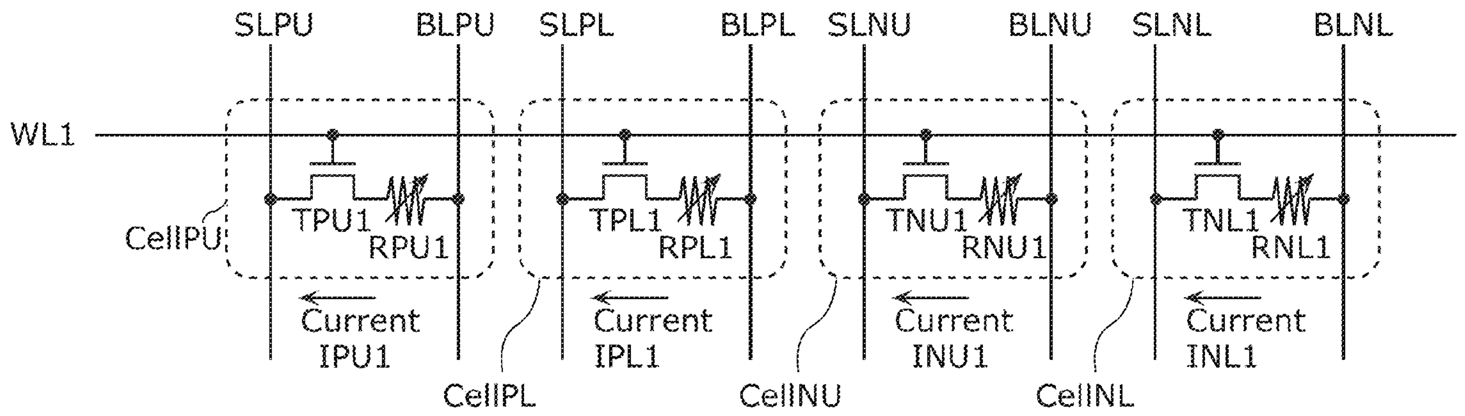
FIG. 11A is a diagram for explaining a configuration of a computation circuit unit for expressing one weight coefficient in the neural network computation circuit according to Embodiment 1.

FIG. 11A is a diagram for explaining a configuration of a computation circuit unit for expressing one weight coefficient in a neural network computation circuit according to Embodiment 1. More specifically, (a) of FIG. 11A illustrates a configuration of a computation circuit unit for expressing one weight coefficient, and (b) of FIG. 11A illustrates cell setting conditions in (a) of FIG. 11A.

As illustrated in (a) of FIG. 11A, a computation circuit unit according to the present embodiment is a computation circuit unit that holds a weight coefficient having a positive value or a negative value and corresponding to input data that selectively takes on a first logical value or a second logical value, and provides current corresponding to a product of the input data and the weight coefficient, the computation circuit unit including: word line WL1; a first data line (source line SLPU); a second data line (bit line BLPU); a third data line (source line SLPL); a fourth data line (bit line BLPL); a fifth data line (source line SLNU); a sixth data line (bit line BLNU); a seventh data line (source line SLNL); an eighth data line (bit line BLNL); a first nonvolatile semiconductor storage element (nonvolatile variable resistance element RPU1); a second nonvolatile semiconductor storage element (nonvolatile variable resistance element RPL1); a third nonvolatile semiconductor storage element (nonvolatile variable resistance element RNU1); a fourth nonvolatile semiconductor storage element (nonvolatile variable resistance element RNL1); first selection transistor TPU1; second selection transistor TPL1; third selection transistor TNU1; and fourth selection transistor TNL1.

A gate of first selection transistor TPU1, a gate of second selection transistor TPL1, a gate of third selection transistor TNU1, and a gate of fourth selection transistor TNL1 are connected to word line WL1, one terminal of the first nonvolatile semiconductor storage element (nonvolatile variable resistance element RPU1) and a drain terminal of first selection transistor TPU1 are connected, one terminal of the second nonvolatile semiconductor storage element (nonvolatile variable resistance element RPL1) and a drain terminal of second selection transistor TPL1 are connected, one terminal of the third nonvolatile semiconductor storage element (nonvolatile variable resistance element RNU1) and a drain terminal of third selection transistor TNU1 are connected, and one terminal of the fourth nonvolatile semiconductor storage element (nonvolatile variable resistance element RNL1) and a drain terminal of fourth selection transistor TNL1 are connected. The first data line (source line SLPU) and a source terminal of first selection transistor TPU1 are connected, the third data line (source line SLPL) and a source terminal of second selection transistor TPL1 are connected, the fifth data line (source line SLNU) and a source terminal of third selection transistor TNU1 are connected, the seventh data line (source line SLNL) and a source terminal of fourth selection transistor TNL1 are connected. The second data line (bit line BLPU) and another terminal of the first nonvolatile semiconductor storage element (nonvolatile variable resistance element RPU1) are connected, the fourth data line (bit line BLPL) and another terminal of the second nonvolatile semiconductor storage element (nonvolatile variable resistance element RPL1) are connected, the sixth data line (bit line BLNU) and another terminal of the third nonvolatile semiconductor storage element (nonvolatile variable resistance element RNU1) are connected, the eighth data line (bit line BLNL) and another terminal of the fourth nonvolatile semiconductor storage element (nonvolatile variable resistance element RNL1) are connected.

The first nonvolatile semiconductor storage element (nonvolatile variable resistance element RPU1) holds, as a resistance value, information of a positive weight coefficient with a weight different from a weight for the second nonvolatile semiconductor storage element (nonvolatile variable resistance element RPL1), the third nonvolatile semiconductor storage element (nonvolatile variable resistance element RNU1) holds, as a resistance value, information of a negative weight coefficient with a weight different from a weight for the fourth nonvolatile semiconductor storage element (nonvolatile variable resistance element RNL1).

By the first data line (source line SLPU), the third data line (source line SLPL), the fifth data line (source line SLNU), and the seventh data line (source line SLNL) being grounded and the second data line (bit line BLPU), the fourth data line (bit line BLPL), the sixth data line (bit line BLNU), and the eighth data line (bit line BLNL) each being applied with a voltage, the computation circuit unit provides, based on current flowing through the second data line (bit line BLPU), the fourth data line (bit line BLPL), the sixth data line (bit line BLNU), and the eighth data line (bit line BLNL), (i) current corresponding to the product obtained from the input data having the first logical value when word line WL1 is non-selected, and (ii) current corresponding to the product obtained from the input data having the second logical value when word line WL1 is selected.

The first nonvolatile semiconductor storage element (nonvolatile variable resistance element RPU1) holds information of an upper digit of an absolute value of the positive weight coefficient, the second nonvolatile semiconductor storage element (nonvolatile variable resistance element RPL1) holds information of a lower digit of the absolute value of the positive weight coefficient, the third nonvolatile semiconductor storage element (nonvolatile variable resistance element RNU1) holds information of an upper digit of an absolute value of the negative weight coefficient, and the fourth nonvolatile semiconductor storage element (nonvolatile variable resistance element RNL1) holds information of a lower digit of the absolute value of the negative weight coefficient.

More specifically, one computation circuit unit illustrated in (a) of FIG. 11A includes four cells that each include a selection transistor and a nonvolatile variable resistance element. Two cells are assigned to each sign of a weight coefficient. CellPU and CellPL are used for a positive weight coefficient, whereas CellNU and CellNL are used for a negative weight coefficient. Two cells are provided for each sign. For the positive weight coefficient, CellPU is referred to as an upper-level cell, and CellPL is referred to as a lower-level cell. A method is to be described, which is for setting current levels for an upper-level cell and a lower-level cell with regard to an absolute value of a weight coefficient after separating into two cells for each sign.

First, cell-current upper limit Imax of each cell current is determined within a range that is not influenced by a clamped current when current is added up. In the experimental data stated above, influence due to clamp can be reduced by setting cell-current upper limit Imax to about one third of Imax0, and thus description is given in this embodiment based on this (refer to (b) of FIG. 11A).

When a quantization bit count that is to be originally expressed is seven bits, half the bit count, that is, a quantization level count is reduced to about its square root to set the current. Thus, the lower four bits when a weight is quantized are assigned to lower-level cell CellPL, and upper three bits are assigned to upper-level cell CellPU. An advantage of assigning bits in this manner is that cell current per quantization unit can be increased by decreasing the quantization bit count, as shown in the table in (b) of FIG. 11A.

When a relation between bit count B of quantization and decrease rate R of cell-current upper limit Imax is considered, separating bits into upper and lower bits is dividing quantization level count 2^B originally expressed into 2^(B/2) each. Here, 2 means 2 to the power of B. In addition, a value as a result of division is rounded up to an integer value herein. Thus, change rate Runit of cell current per quantization unit is:

$$Runit = R \times (2^{\wedge}B - 1)/(2^{\wedge}(B/2) - 1)$$

If current decrease rate R that makes Runit exceed 1 can be set, entire current can be decreased without decreasing cell current per quantization unit. Halving bit count B yields an effect of reducing the entirety into an about square root. The effect is greater than that achieved with decrease rate R of a constant multiple from the viewpoint of the complexity order, and it can be expected that setting Runit in this manner is relatively easy. In the description above, $$Runit = (1/3) \times (2^{\wedge}7 - 1)/(2^{\wedge}4 - 1) = 2.67$$

Hence, while cell current per quantization unit is increased by 2.67 times, total current that flows through a bit line when a multiply-accumulate operation is performed can be reduced to one third.

By configuring a computation circuit unit using four cells in this manner, antinomic issues of reduction in current and maintaining accuracy are addressed, and at the same time, when such a computation circuit unit is provided in a neural network computation circuit, a multiply-accumulate operation is performed for each of an upper-level cell and a lower-level cell for the positive and negative weight coefficients, and thus in order to obtain final output, the final output is to be determined by integrating a computation result of the upper-level cell and a computation result of the lower-level cell.

FIG. 11B illustrates a comparison between conventional technology and an embodiment with regard to setting conditions and features of cells. Here, out of the "Conventional condition" columns, the "Conventional condition 1" column corresponds to conventional technology illustrated in (b) of FIG. 9, the "Conventional condition 2" column corresponds to conventional technology illustrated in (c) of FIG. 9, and the "Embodiment" column corresponds to the embodiment illustrated in (b) of FIG. 11A.

As illustrated in FIG. 11B, "Cell-current upper limit Imax of element" is Imax0 under "Conventional condition 1", Imax0/3 under "Conventional condition 2", and Imax0/3 according to "Embodiment". Hence, the "Linearity" of total current is "Deteriorated" under "Conventional condition 1", "Improved" under "Conventional condition 2", and "Improved" according to "Embodiment".

"Cell current per quantization unit" is Imax0/127 under "Conventional condition 1", Imax0/127/3 under "Conventional condition 2", and Imax0/15/3 according to "Embodiment". Thus, "Current accuracy" of cell current is "Deteriorated" under "Conventional condition 2" and "Unchanged or Improved" according to "Embodiment" when the value under "Conventional condition 1" is regarded as "Reference value".

As described above, "Conventional technology" has an issue of an allowable current amount of a bit line through which total current flows (linearity of total current) and an antinomic issue of maintaining current accuracy when a current is decreased. In contrast, a computation circuit unit according to the embodiment can achieve both maintaining current accuracy and reduction in total current.

Figure 11C:
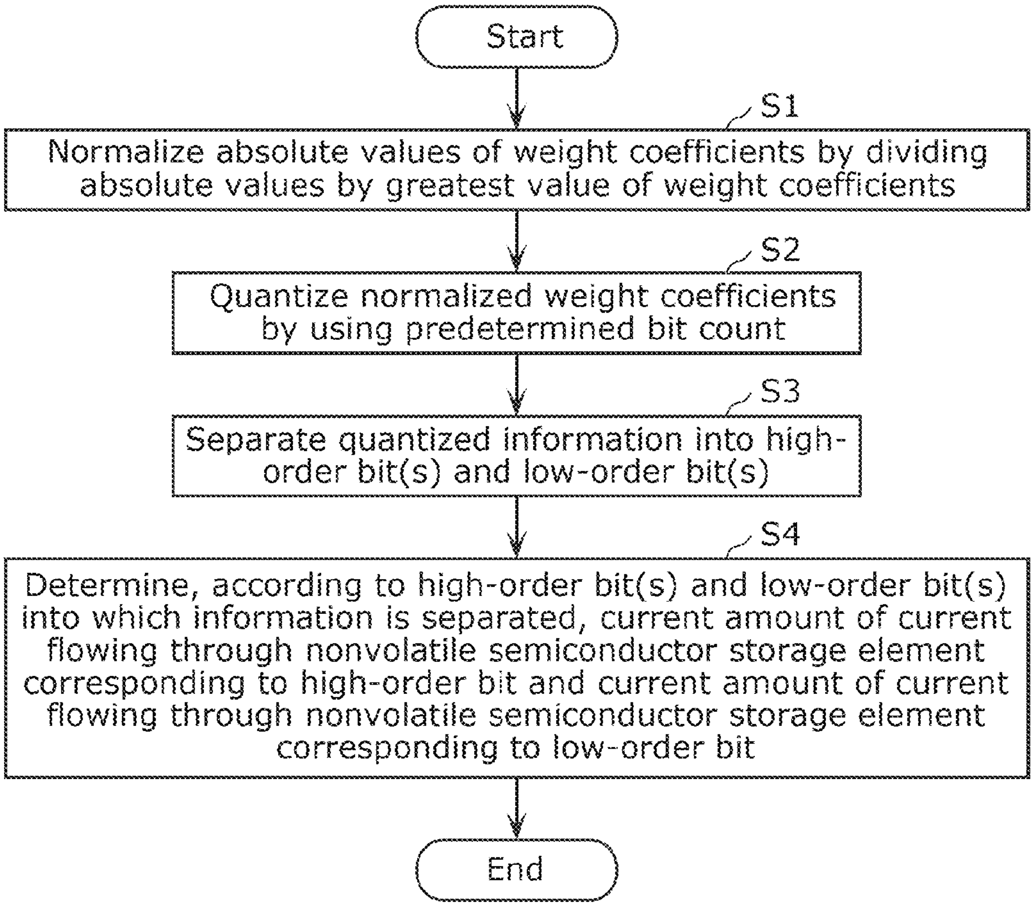
FIG. 11C is a flowchart showing an algorithm for separating a weight coefficient into a high-order bit and a low-order bit.

As described above, an algorithm for separating a weight coefficient into one or more high-order bits and one or more low-order bits is illustrated in FIG. 11C as an example of a method for driving a neural network computation circuit. FIG. 11C is a flowchart showing an algorithm for separating a weight coefficient into high-order bits and low-order bits. First, absolute values of weight coefficients of plural computation circuit units included in a neural network computation circuit are normalized by dividing the absolute values by the maximum value of the weight coefficients (S1), and the normalized weight coefficients are quantized by using a predetermined bit count (for example, seven bits) (S2). Then, quantized information is separated into high-order bits (for example, three high-order bits) and low-order bits (for example, four low-order bits) (S3). According to the separated high-order bits and low-order bits, the current amounts of current flowing through nonvolatile semiconductor storage elements corresponding to the high-order bits included in the plural computation circuit units are determined (for example, cell-current upper limit Imax is set to about one third of Imax0), and the current amount of current flowing through nonvolatile semiconductor storage elements corresponding to the low-order bits (for example, cell-current upper limit Imax is set to about one third of Imax0) (S4).

Figure 1:
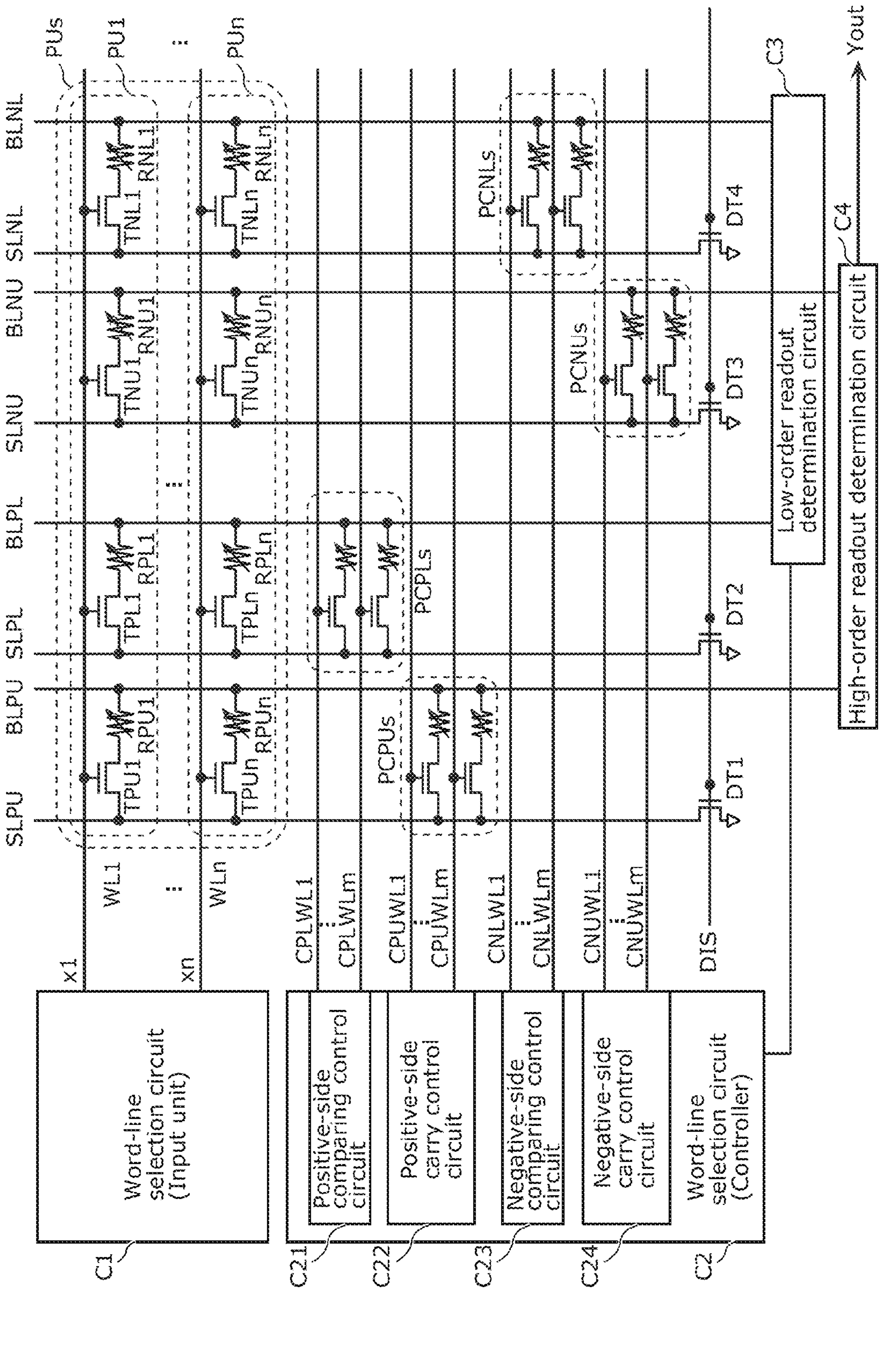
FIG. 1 illustrates a configuration of a neural network computation circuit according to Embodiment 1.
Figure 2:
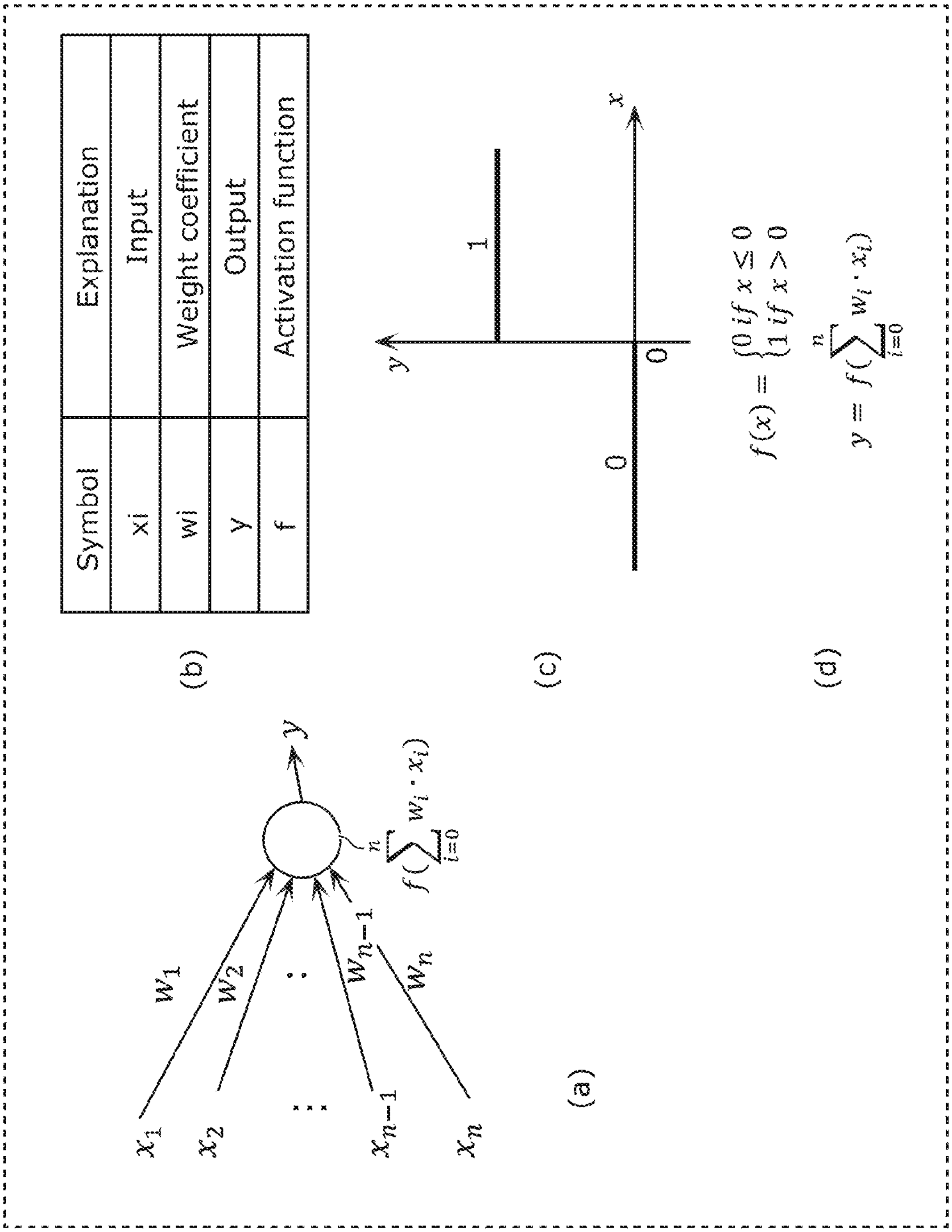
FIG. 2 is a drawing for explaining a calculation model of a neuron included in a neural network.
Figure 3:
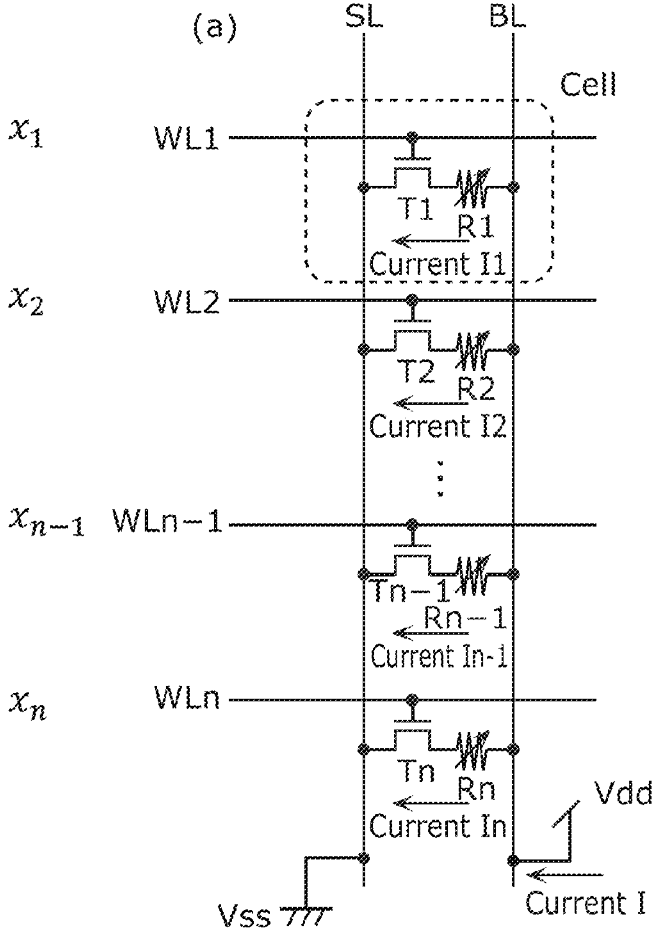
FIG. 3 is a diagram for explaining a typical circuit configuration for performing a multiply-accumulate operation.
Figure 4:
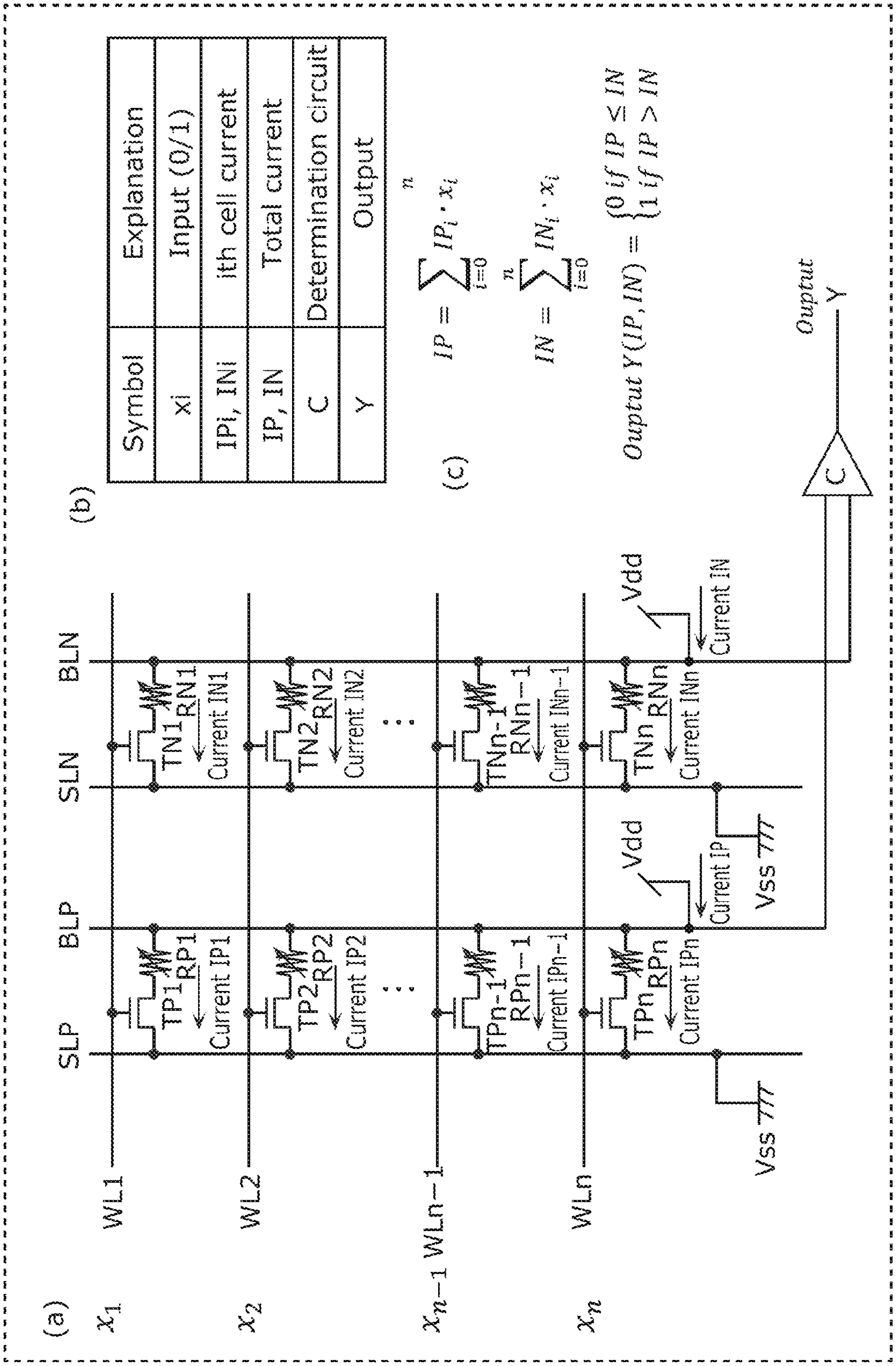
FIG. 4 is a diagram for explaining a configuration that includes a multiply-accumulate operation circuit that uses total current and a determination circuit.
Figure 5:
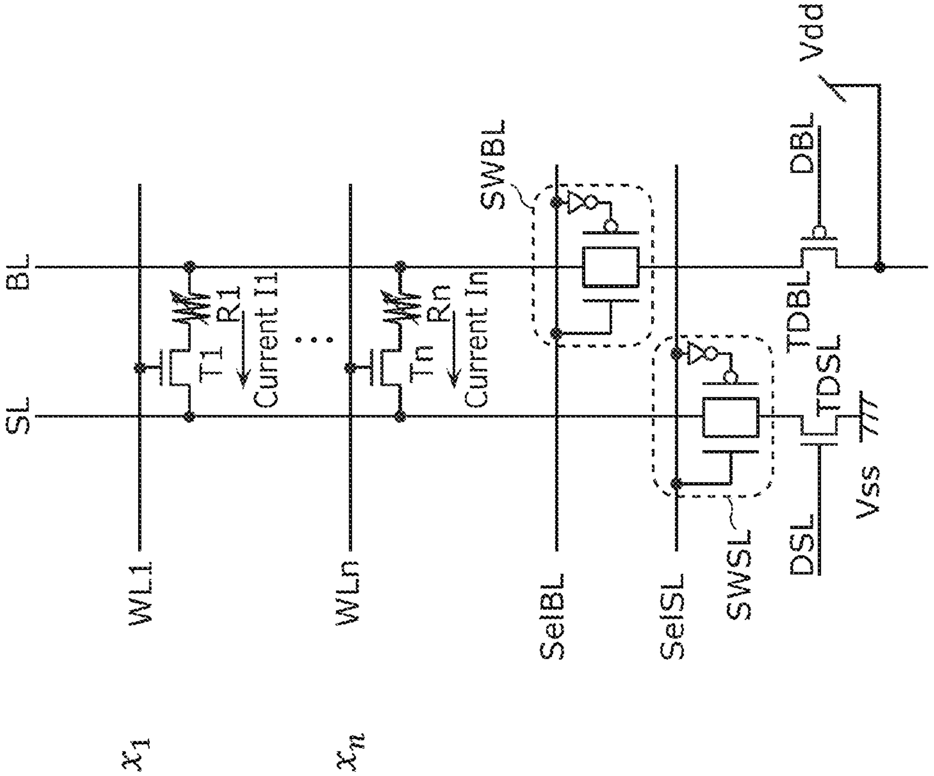
FIG. 5 is a circuit diagram illustrating an example of a transistor circuit that is normally included in a multiply-accumulate operation circuit that uses total current.
Figure 6:
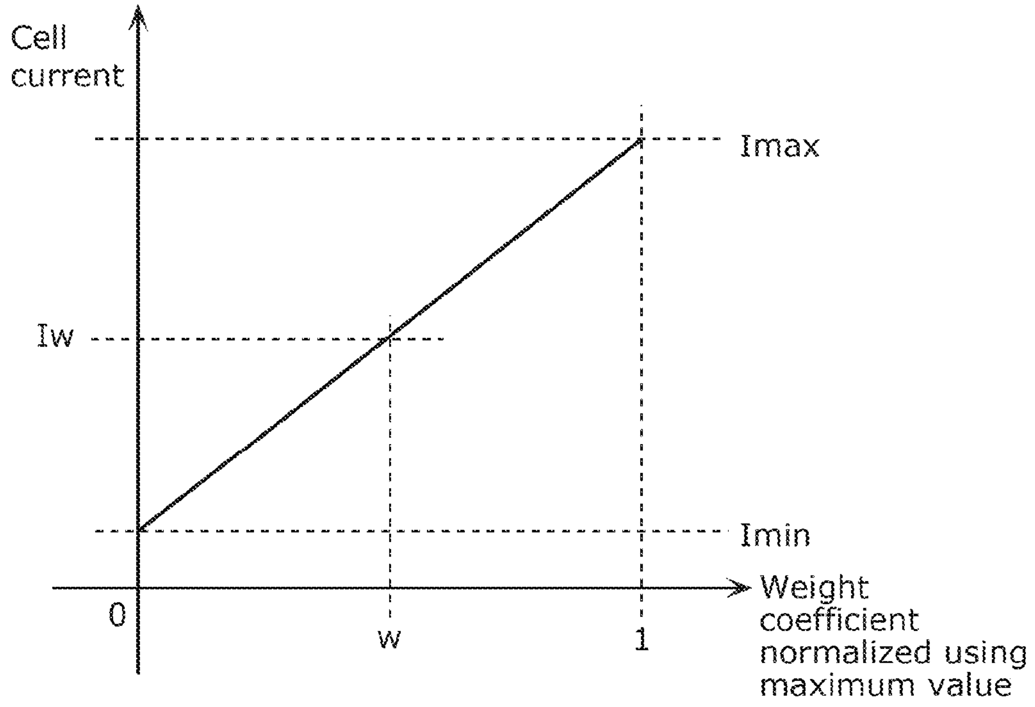
FIG. 6 is a graph showing a relation between an ideal weight coefficient and cell current.
Figure 7:
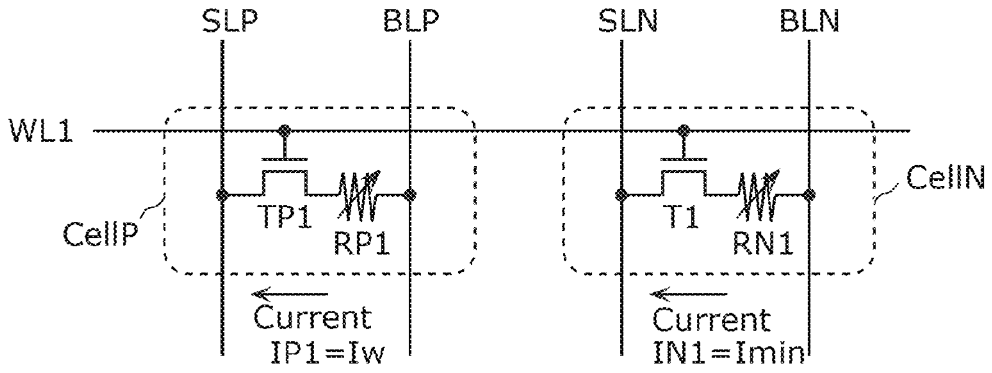
FIG. 7 illustrates current values of two cells when a weight coefficient with a sign is expressed using the two cells.

Next, a configuration of a neural network computation circuit that includes such computation circuit units is to be described with reference to FIG. 1. A specific circuit configuration is illustrated in FIG. 1. FIG. 1 illustrates a configuration of a neural network computation circuit according to Embodiment 1. The neural network computation circuit includes: main region PUs that includes plural computation circuit units PUn; first additional region PCPLs, second additional region PCPUs, third additional region PCNLs, and fourth additional region PCNUs each of which includes a selection transistor and a nonvolatile semiconductor storage element having a structure identical to the structure of nonvolatile semiconductor storage elements included in plural computation circuit units PUn; a first control circuit (positive-side comparing control circuit C21) for selecting word line WL1 to be connected to a gate of a selection transistor in first additional region PCPLs; a second control circuit (positive-side carry control circuit C22) for selecting word line WL1 to be connected to a gate of a selection transistor in second additional region PCPUs; a third control circuit (negative-side comparing control circuit C23) for selecting word line WL1 to be connected to a gate of a selection transistor in third additional region PCNLs; a fourth control circuit (negative-side carry control circuit C24) for selecting word line WL1 to be connected to a gate of a selection transistor in fourth additional region PCNUs; a first node (a terminal connected to source line SLPU); a second node (a terminal connected to bit line BLPU); a third node (a terminal connected to source line SLPL); a fourth node (a terminal connected to bit line BLPL); a fifth node (a terminal connected to source line SLNU); a sixth node (a terminal connected to bit line BLNU); a seventh node (a terminal connected to source line SLNL); an eighth node (a terminal connected to bit line BLNL); a first determination circuit (higher-order readout determination circuit C4); and a second determination circuit (lower-order readout determination circuit C3).

A first data line (source line SLPU) included in each of computation circuit units PUn in main region PUs is connected to the first node (the terminal connected to source line SLPU), a second data line (bit line BLPU) included in each of computation circuit units PUn in main region PUs is connected to the second node (the terminal connected to bit line BLPU), and a third data line (source line SLPL) included in each of computation circuit units PUn in main region PUs is connected to the third node (the terminal connected to source line SLPL). A fourth data line (bit line BLPL) included in each of computation circuit units PUn in main region PUs is connected to the fourth node (the terminal connected to bit line BLPL), and a fifth data line (source line SLNU) included in each of computation circuit units PUn in main region PUs is connected to the fifth node (the terminal connected to source line SLNU), a sixth data line (bit line BLNU) included in each of computation circuit units PUn in main region PUs is connected to the sixth node (the terminal connected to bit line BLNU), a seventh data line (source line SLNL) included in each of computation circuit units PUn in main region PUs is connected to the seventh node (the terminal connected to source line SLNL), and an eighth data line (bit line BLNL) included in each of computation circuit units PUn in main region PUs is connected to the eighth node (the terminal connected to bit line BLNL). The first determination circuit (higher-order readout determination circuit C4) is connected to the second node and the sixth node (terminals connected to bit line BLNU), the second determination circuit (lower-order readout determination circuit C3) is connected to the fourth node and the eighth node (terminals connected to bit line BLNL), the first control circuit (positive-side comparing control circuit C21) is connected to word line WL1 in first additional region PCPLs, the second control circuit (positive-side carry control circuit control circuit C22) is connected to word line WL1 in second additional region PCPUs, the third control circuit (negative-side comparing control circuit C23) is connected to word line WL1 in third additional region PCNLs, the fourth control circuit (negative-side carry control circuit control circuit C24) is connected to word line WL1 in fourth additional region PCNUs, and corresponding binary data is input to each of word lines WL1 to WLn in main region PUs.

By the third node (a terminal connected to source line SLPL) and the seventh node (a terminal connected to source line SLNL) being grounded and the fourth node (a terminal connected to bit line BLPL) and the eighth node (a terminal connected to bit line BLNL) each being applied with a voltage, based on current flowing through the fourth node and the eighth node, the neural network computation circuit determines a low-order computation result by controlling the first control circuit (positive-side comparing control circuit C21) and the third control circuit (negative-side comparing control circuit C23), and the second determination circuit (lower-order readout determination circuit C3), and determines, based on the low-order computation result, control of the second control circuit (positive-side carry control circuit C22) and the fourth control circuit (negative-side carry control circuit C24). By the first node (a terminal connected to source line SLPU) and the fifth node (a terminal connected to source line SLNU) being grounded and the second node (a terminal connected to bit line BLPU) and the sixth node (a terminal connected to bit line BLNU) each being applied with a voltage, the neural network computation circuit outputs a computation result corresponding to a sum of products obtained by plural computation circuit units PUn, by using the first determination circuit (higher-order readout determination circuit C4).

The first control circuit (positive-side comparing control circuit C21), the second control circuit (positive-side carry control circuit C22), the third control circuit (negative-side comparing control circuit C23), and the fourth control circuit (negative-side carry control circuit C24) cause first additional region PCPLs, second additional region PCPUs, third additional region PCNLs, and fourth additional region PCNUs to pass current having a predetermined current amount to the first node (a terminal connected to source line SLPU), the third node (a terminal connected to source line SLPL), the fifth node (a terminal connected to source line SLNU), and the seventh node (a terminal connected to source line SLNL).

More specifically, current is set for each cell to cause computation circuit units PU1, . . . , PUn each including four cells to express a weight coefficient according to the method stated above. Computation circuit units PU1, . . . , PUn are connected by common source lines SLPU, SLPL, SLNU, and SLNL and common bit lines BLPU, BLPL, BLNU, and BLNL, to have the same relations between high-order cells and between low-order cells for the positive sign and the negative sign. Word-line selection circuit C1 controls word lines WL1, . . . , WLn according to input vector x=(x1, x2, . . . , xn) of a neural network.

A DIS signal and source line selection transistors DT1, . . . , DT4 in the drawing control connections of source lines SLPU, SLPL, SLNU, and SLNL to the ground (Vss). When a readout operation is performed, the DIS signal is activated, and functions as a ground for current applied from the readout determination circuits (lower-order readout determination circuit C3 and higher-order readout determination circuit C4). Lower-order readout determination circuit C3 and higher-order readout determination circuit C4 each include a drive circuit that applies readout current to the connected bit lines, and a circuit that determines the magnitude of current flowing through the pair of connected bit lines. The readout determination circuits can be considered to have various configurations, but an example of a configuration with minimum functionality is to be described later.

The neural network computation circuit includes additional regions PCPLs and PCNLs that include memory cells for use in comparing results of multiply-accumulate operations of low-order cells, and additional regions PCPUs and PCNUs for adding carries of results of multiply-accumulate operations of low-order cells to high-order cells, in addition to main region PUs that includes the computation circuit units that each express a weight coefficient.

Word-line selection circuit C2 for controlling such additional regions is provided. Word-line selection circuit C2 includes positive-side carry control circuit C22, positive-side comparing control circuit C21, negative-side carry control circuit C24, and negative-side comparing control circuit C23 that are selection circuits that control selection and non-selection of memory cells in additional regions PCPUs, PCPLs, PCNUs, and PCNLs, and a logical circuit block (not illustrated) that calculates a carry to high-order cells from the result of computation in low-order cells in conjunction with lower-order readout determination circuit C3, in particular.

Figure 12:
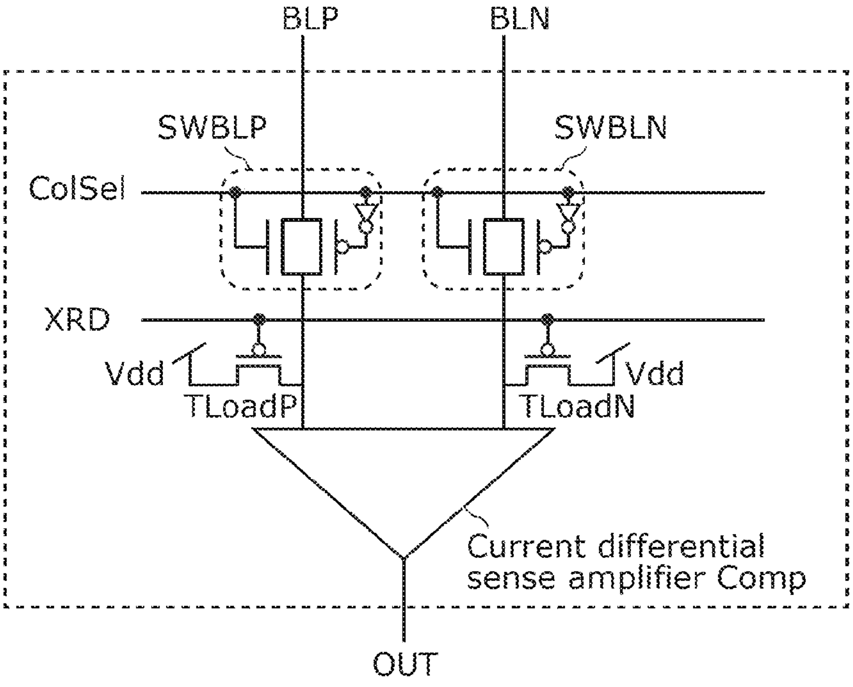
FIG. 12 is a circuit diagram illustrating an example of readout determination circuits.

FIG. 12 illustrates an example of a configuration of readout determination circuits (lower-order readout determination circuit C3 and higher-order readout determination circuit C4) in FIG. 1. FIG. 12 is a circuit diagram illustrating an example of the readout determination circuits (lower-order readout determination circuit C3 and higher-order readout determination circuit C4). Bit lines BLP and BLN through which inputs are made correspond to connected bit line nodes on the positive and negative sides, respectively. The readout determination circuits each include: a readout drive circuit that includes same readout power supplies Vdd, readout power supply connection transistors TLoadP and TLoadN that connect readout power supplies Vdd to the bit lines, and a line for transferring an XRD signal that is a readout activation signal; bit-line selection switches SWBLP and SWBLN for selecting a corresponding bit line; and a line for transferring a ColSel signal that is a select signal for selecting on/off thereof. Readout current is applied to the bit line pair by setting the XRD signal to the low state in a state where the ColSel signal is set to the high state with the bit line pair being selected. Amounts of current flowing through bit lines BLP and BLN at this time are determined using differential sense amplifier Comp, and the result is output Yout of the readout determination circuit.

Figure 13:
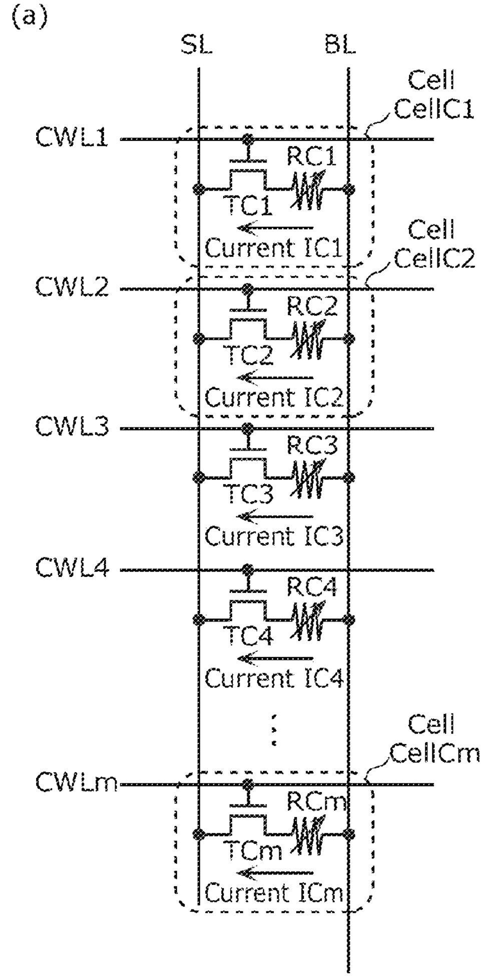
FIG. 13 is a diagram for explaining a configuration of an additional region according to Embodiment 1.

All additional regions PCPUs, PCPLs, PCNUs, and PCNLs in FIG. 1 have the same configuration, and embodiments to be adopted for the cells in the additional regions are to be described with reference to FIG. 13. FIG. 13 is a diagram for explaining a configuration of an additional region according to Embodiment 1. More specifically, (a) of FIG. 13 is a circuit diagram illustrating a configuration of an additional region according to Embodiment 1, (b) of FIG. 13 illustrates a table showing conditions that can be set for the cells in (a) of FIG. 13, and (c) of FIG. 13 illustrates examples of cell current in the additional region in (a) of FIG. 13. The additional region may include a plurality of cells, and each cell may have the same cell configuration as that of the main region, or stated differently, may include a selection transistor having the same size and the same nonvolatile variable resistance element. Predetermined values are set in advance for cell current IC1, . . . , ICm of cells CellC1, . . . , CellCm. A current setting method may satisfy conditions that are to be described next, based on a method for selecting selection word lines CW1, . . . , CWm. Thus, when a maximum value of a sum of level values added in a multiply-accumulate operation in the main region connected to same bit line BL is T, a level value for each of cells CellC1, . . . , CellCm in the additional region in order that a level value from 0 to T can be selected by appropriately selecting selection word lines CW1, . . . , CWm.

As an example of a setting method for satisfying conditions for cell current flowing through the cells, (c) of FIG. 13 shows a setting method. As illustrated in (b) of FIG. 13, in the present embodiment, cell-current upper limit Imax in the main region is reduced to Imax0/3, and the number of quantization levels is divided into 15. Thus, cell current Iunit per quantization unit for cell current in the main region is determined to be:

$$Iunit = I\max0/3/15$$

and current through a memory cell is set to a current value that is an integral multiple of cell current Iunit per quantization unit (refer to (c) of FIG. 13). For a cell in an additional region, current is set to cause the quantization level value to be a power of 2, such as 1, 2, 4, or 8, with reference to cell current Iunit per quantization unit. Considering that cell current can be set up to cell-current upper limit Imax as a property of a nonvolatile variable resistance element itself, since current up to Iunit×32 does not exceed cell-current upper limit Imax in the embodiment, a value up to 32 can be used as a set level value for an additional region. After that, a plurality of cells are provided for which 32 is set, which is the upper limit of a settable level value among the level values that are powers of 2. Memory cell count m is to be determined so that maximum value T of a sum of the level values is exceeded by selecting all additional regions. By setting in this manner, a level value from 0 to T can be selected by appropriately selecting selection word lines CW1, . . . , CWm.

Note that for each cell in additional regions PCPUs, PCPLs, PCNUs, and PCNLs, a structure the same as that of the cells in the main region is to be used, but as long as the configuration can achieve similar effects, a nonvolatile semiconductor storage element may be configured using a different fixed resistance element or a different nonvolatile variable resistance element, for instance. On the other hand, an advantage of adopting the same structure as that of the cells in the main region is that a property of the cells in an additional region can be readily changed when cell current Iunit per quantization unit or cell-current upper limit Imax is changed. In particular, when an analog-to-digital (AD) conversion circuit is provided outside as in PTL 3, if the case where cell current Iunit per quantization unit is to be changed is assumed, a more accurate AD conversion circuit and more accurate computation are to be used, so that an increase in circuit scale is expected. Many nonvolatile variable resistance elements exhibit a change in resistance to a certain degree due to an elapse of time when being kept for a long time. In order to address this, it can be considered that a change in relative difference in cell current can be reduced by adopting the same cell structure. Hence, it is considered that the same elements are to be included, rather than providing an additional region or an AD conversion circuit using other external structures.

Figure 14:
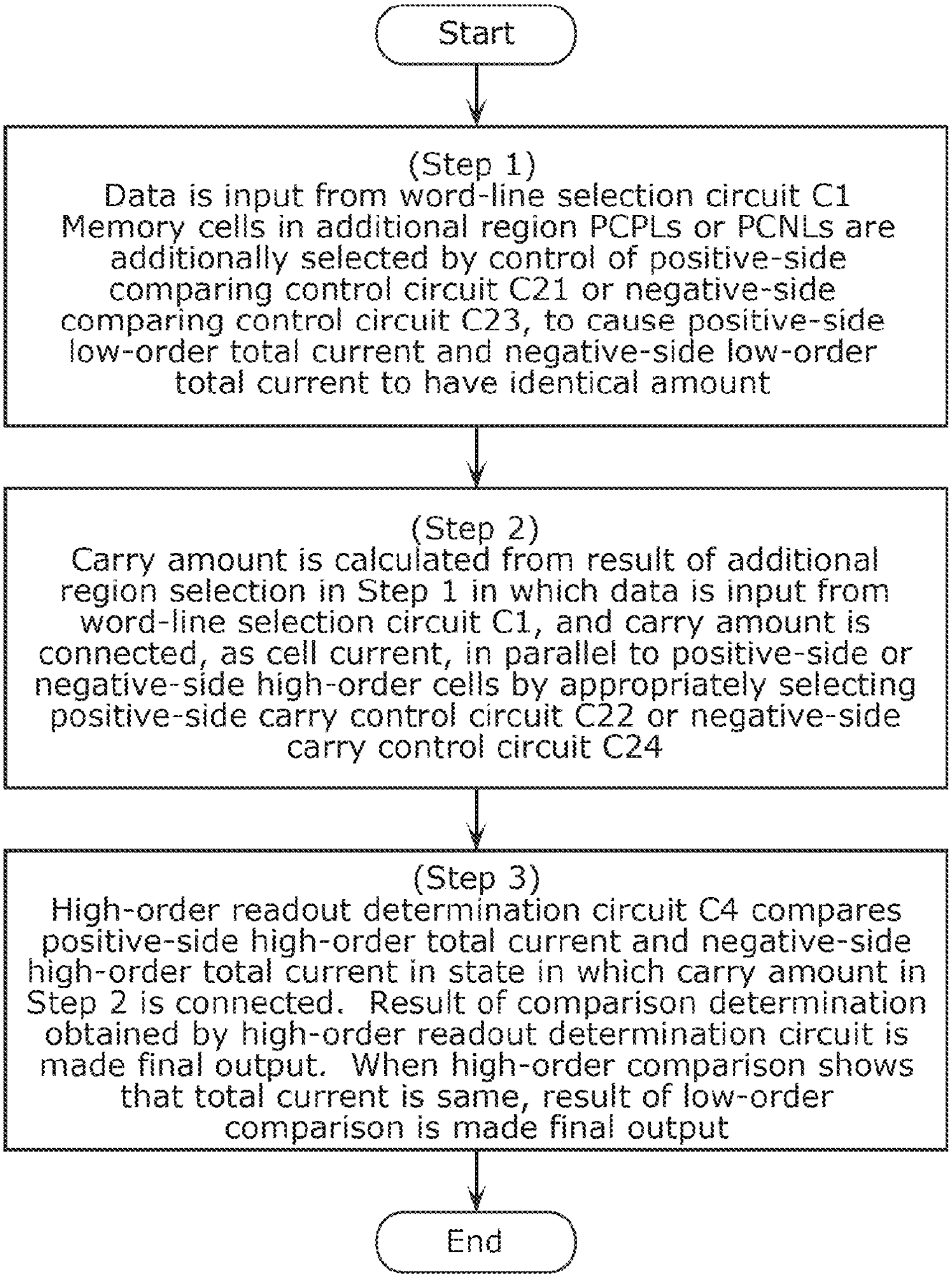
FIG. 14 is a flowchart showing readout operation of the neural network computation circuit according to Embodiment 1.

FIG. 14 is a flowchart showing operation of the neural network computation circuit according to the present embodiment (that is, a method for driving the neural network computation circuit). In the neural network computation circuit according to the present embodiment, two phases of operation (operation phase Step 1 and operation phase Step 2) are to be performed to finish performing one multiply-accumulate operation. Thus, operation is preformed through operation phase Step 1 in which a multiply-accumulate operation of low-order cells is performed, total current of positive side low-order cells and total current of negative side low-order cells are compared, and a difference in current is calculated as a level value by using an additional region on the low-order cell side and its selecting method, and operation phase Step 2 in which a carry of the level value is calculated based on the level value calculated in operation phase Step 1, and the carry amount is connected, as parallel cell current, by using an additional region on the high-order cell side and a selection method, and a multiply-accumulate operation of high-order cells is performed. After that, in readout determination (operation phase Step 3), as a final output of the result of a multiply-accumulate operation as a neural network computation circuit, a comparison result of high-order cells is preferentially adopted, and if the comparison result of the high-order cells shows that the operation results are the same, a comparison result of low-order cells is adopted.

First, operation phase Step 1 that is a first phase is to be described in detail. As illustrated in FIG. 14, in operation phase Step 1, data is first input from word-line selection circuit C1. This process corresponds to a process of selecting a word line in the main region for an input signal to the neural network computation circuit. Next, memory cells in additional region PCPLs or PCNLs are additionally selected by the control of positive-side comparing control circuit C21 or negative-side comparing control circuit C23, to cause positive-side low-order total current and negative-side low-order total current to have an identical amount. This process corresponds to a process of determining a low-order computation result by controlling the first control circuit, the third control circuit, and the second determination circuit, based on current flowing through the fourth node and the eighth node.

Figure 15:
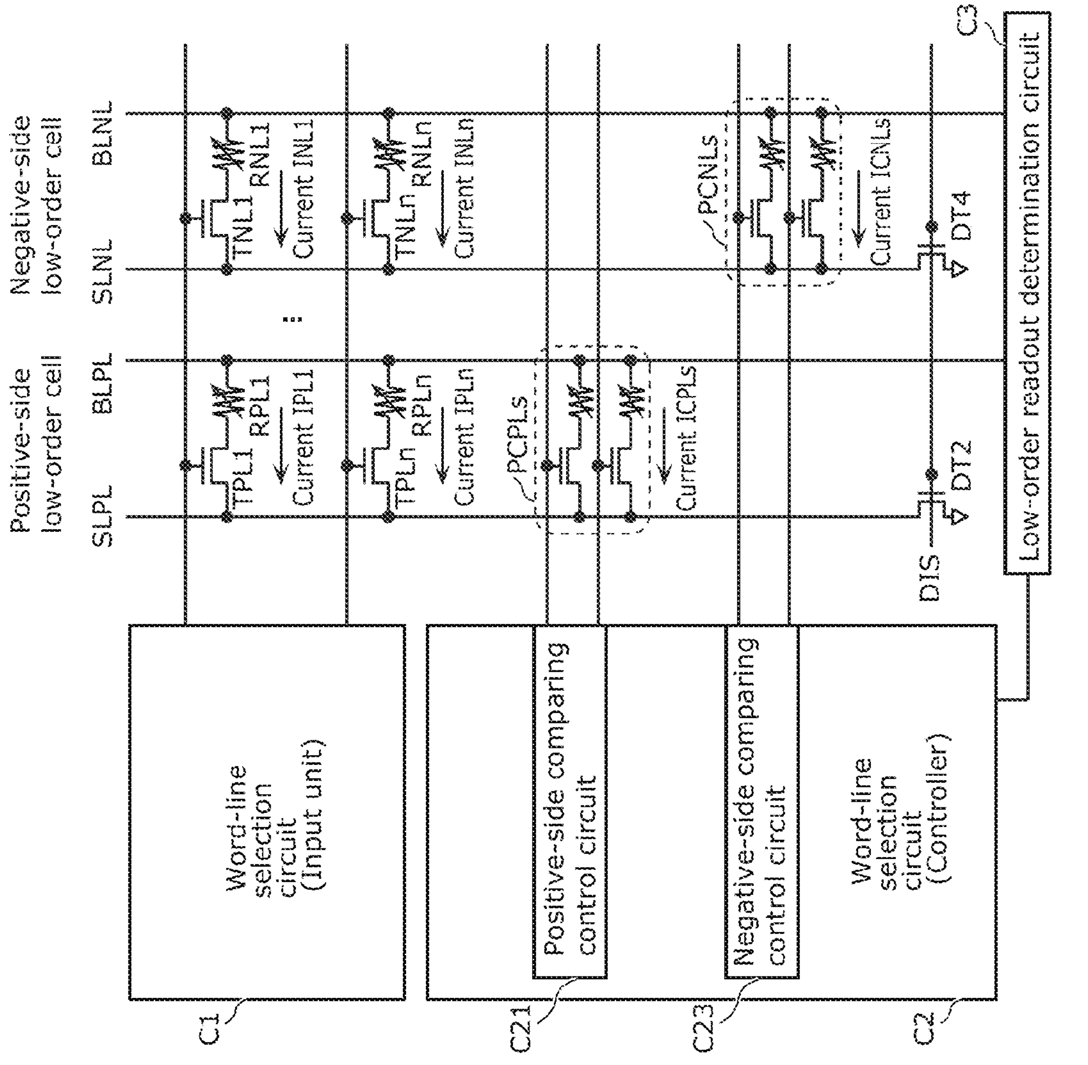
FIG. 15 is an excerpt of a circuit configuration from FIG. 1 for a first operation phase of the readout operation of the neural network computation circuit according to Embodiment 1.
Figure 16:
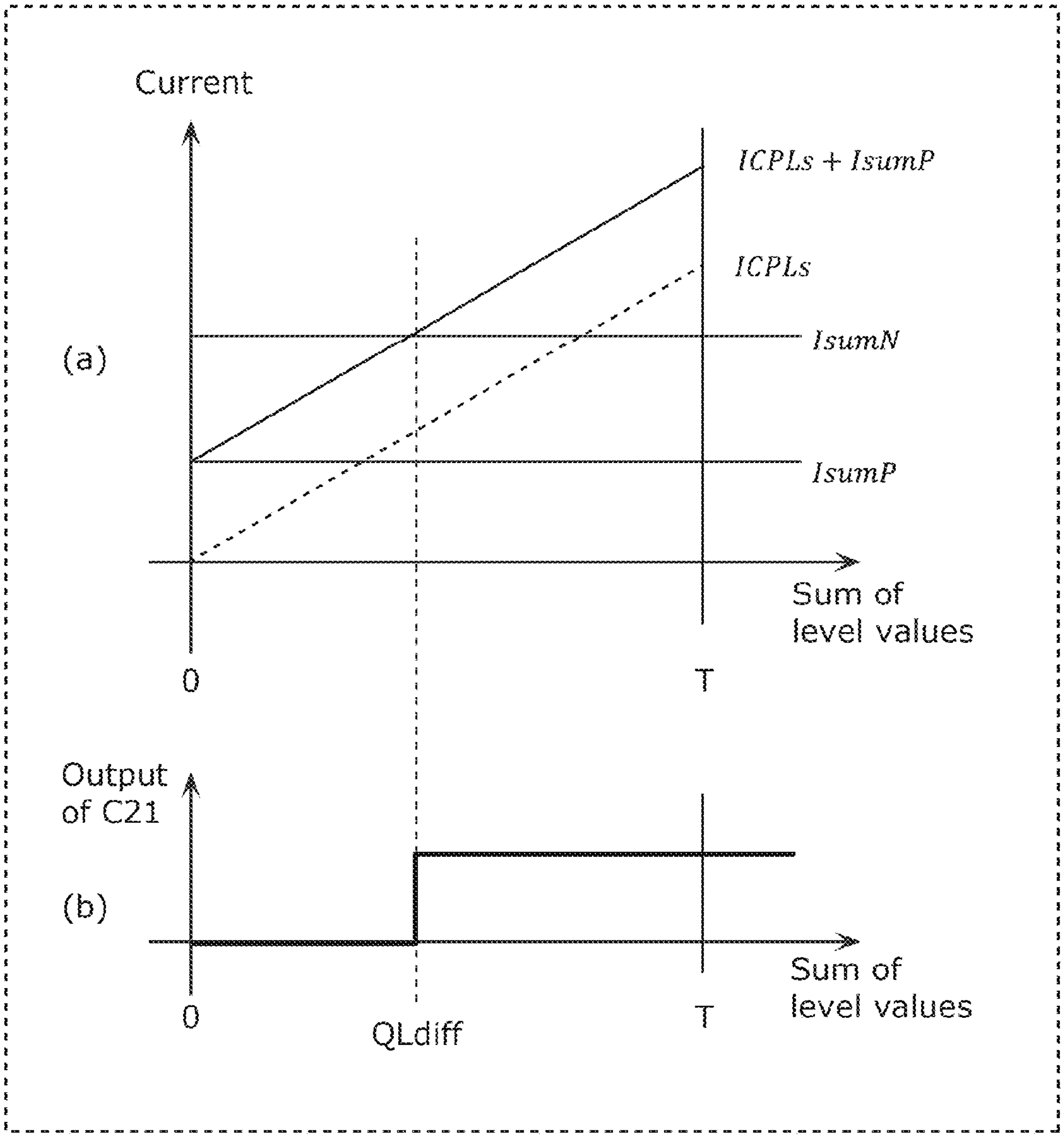
FIG. 16 is a drawing for explaining calculation for calculating a carry, in the readout operation of a word-line selection circuit in the neural network computation circuit according to Embodiment 1.

Circuit operation in operation phase Step 1 is to be described in detail, with reference to FIG. 15 and FIG. 16. FIG. 15 is an excerpt of a circuit configuration from FIG. 1 for operation phase Step 1 of the neural network computation circuit according to Embodiment 1. In operation phase Step 1, computation is performed by positive-side and negative-side low-order cells in the main region, additional regions PCPLs and PCNLs connected to bit lines BL and source lines SL that are also connected to the low-order cells in the main region, low-order readout determination circuit C3 connected to the bit line pair (BLPL, BLNL), positive-side comparing control circuit C21 that controls cell selection in additional regions PCPLs and PCNLs, and negative-side comparing control circuit C23. First, word-line selection circuit C1 selects a word line corresponding to an input vector for the neural network, and causes low-order readout determination circuit C3 to execute readout. Accordingly, at bit lines BLPL and BLNL connected to the low-order cells, cell current IPL1, . . . IPLn and cell current INL1, . . . , INLn are each added up. Positive-side total current is denoted by IsumP, and negative-side total current is denoted by IsumN. Thus, the following equations are satisfied:

$$IsumP = \sum IPLk \ (k = 1, \ldots , n)$$

$$IsumN = \sum INLk \ (k = 1, \ldots , n)$$

Here, low-order readout determination circuit C3 compares the magnitude of IsumP and IsumN. Word-line selection circuit C2 that has obtained the result of the comparison selects positive-side comparing control circuit C21 when IsumP is less than IsumN, and selects negative-side comparing control circuit C23 when IsumN is less than or equal to IsumP. For the convenience of the description, here, it is assumed that IsumP is less than IsumN so that positive-side comparing control circuit C21 is selected. According to the description of an embodiment of the additional region, if positive-side comparing control circuit C21 is appropriately used, total current ICPLs flowing through cells in additional region PCPLs can be controlled. A method for calculating, by using this, a difference in current between IsumP and IsumN as a level value is to be described next.

An Example of a method for calculating a difference in current between IsumP and IsumN as a level value is to be described with reference to FIG. 16. FIG. 16 is a drawing for explaining calculation for calculating a carry, in the readout operation of word-line selection circuit C2 in the neural network computation circuit according to Embodiment 1. More specifically, (a) of FIG. 16 illustrates a graph with the horizontal axis representing a range of a level value that positive-side comparing control circuit C21 can select, and the vertical axis representing total current ICPLs flowing through additional region PCPLs at that time. IsumP and IsumN are also shown in the graph as being constant irrespective of the selection made by positive-side comparing control circuit C21. The graph also shows a transition of IsumP+ICPLs calculated from these. Part (b) of FIG. 16 illustrates a graph with the horizontal axis representing a range of a level value that positive-side comparing control circuit C21 can select and the vertical axis representing output of positive-side comparing control circuit C21.

As can be seen from (a) and (b) of FIG. 16, with regard to the value of ICPLs+IsumP, the magnitude relation with IsumN is inverted at certain level value QLdiff. The level value at which the magnitude relation is inverted can be obtained as a point at which output of positive-side comparing control circuit C21 is switched as illustrated in (b) of FIG. 16. Thus, word-line selection circuit C2 can determine a point at which ICPLs+IsumP and IsumN are identical by searching for a point at which output of positive-side comparing control circuit C21 is switched by repeating determination by controlling total current ICPLs. For this, linear search for making determination each time total current ICPLs is increased sequentially may be used, or binary search using the binary method as a more time-efficient method may be used.

Figure 17:
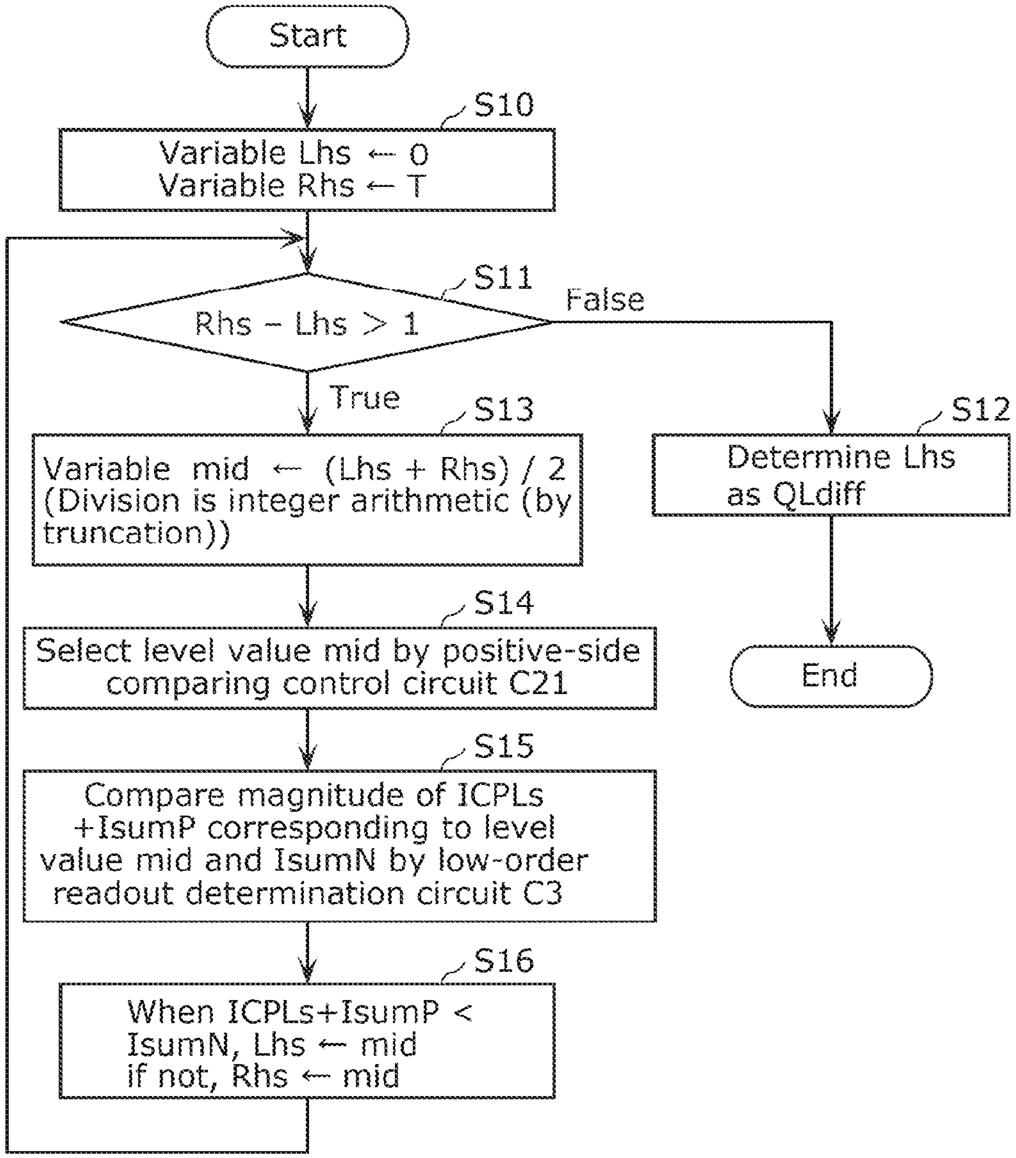
FIG. 17 is a flowchart showing a binary search algorithm used by the word-line selection circuit to obtain change point QLdiff illustrated in FIG. 16.

Binary search is a known technique, yet an example of an algorithm in the present embodiment is shown in FIG. 17. FIG. 17 is a flowchart showing a binary search algorithm used by word-line selection circuit C2 to obtain change point QLdiff illustrated in FIG. 16. First, word-line selection circuit C2 initializes variables as follows: variable Lhs=0, and variable Rhs=T (S10). Next, word-line selection circuit C2 determines whether (Rhs-Lhs) is greater than 1 (S11), and if it is greater (True in S11), a halved value of variable Lhs and variable Rhs (Rhs-Lhs)/2 is set to variable mid (S13). Note that integer arithmetic (a decimal number is truncated) is performed when a halved value is calculated. Subsequently, positive-side comparing control circuit C21 selects, as a level value, a value of variable mid (level value mid) currently calculated (S14).

Then, low-order readout determination circuit C3 compares the magnitude of IsumN and (ICPLs+IsumP corresponding to level value mid) (S15), and based on the result thereof, word-line selection circuit C2 sets variable Lhs to the value of variable mid when (ICPLs+IsumP corresponding to level value mid)<IsumN, and sets variable Rhs to the value of variable mid if not (S16), after which, steps S11 to S16 are repeated again.

In step S11, when (Rhs-Lhs) is determined not to be greater than 1 (False in S11), word-line selection circuit C2 determines the value of variable Lhs as change point QLdiff (S12).

Next, operation phase Step 2 that is the second phase in the flowchart in FIG. 14 is to be described in detail. As illustrated in FIG. 14, in operation phase Step 2, a carry amount is calculated from a result of the additional region selection in operation phase Step 1 in which data is input from word-line selection circuit C1, and the carry amount is connected, as cell current, in parallel to positive-side or negative-side high-order cells by appropriately selecting positive-side carry control circuit C22 or negative-side carry control circuit C24. This process corresponds to a process of determining control of the second control circuit and the fourth control circuit, based on the low-order computation result.

Figure 18:
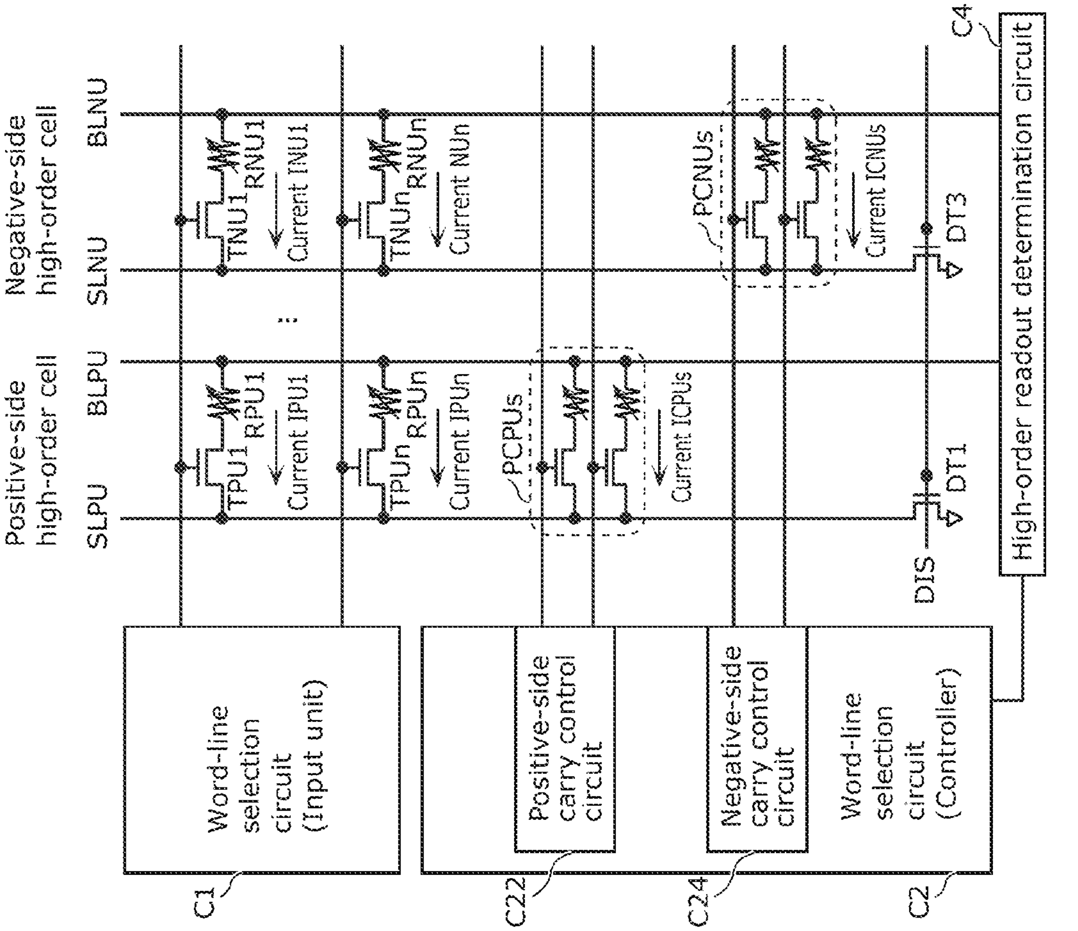
FIG. 18 is an excerpt of a circuit configuration from FIG. 1 for a second operation phase of the readout operation of the neural network computation circuit according to Embodiment 1.

Circuit operation in operation phase Step 2 is to be described in detail, with reference to FIG. 18. FIG. 18 is an excerpt of a circuit configuration from FIG. 1 for operation phase Step 2 of the readout operation of the neural network computation circuit according to Embodiment 1. In operation phase Step 2, computation is performed by positive-side and negative-side high-order cells in the main region, additional regions PCPUs and PCNUs connected to bit lines BL and source lines SL that are also connected to the high-order cells in the main region, high-order readout determination circuit C4 connected to the bit line pair (BLPU, BLNU), positive-side carry control circuit C22 that controls cell selection in additional regions PCPLUs and PCNUs, and negative-side carry control circuit C24.

In second operation phase Step 2, a level value of a carry amount is obtained from difference level value QLdiff of multiply-accumulate operations of low-order cells obtained in first operation phase Step 1, and readout is performed in a state in which the level value is added. In the present embodiment, quantization levels for weight coefficients of the cells are expressed using two cells for each sign. In particular, the base that shows digits of a high-order bit and a low-order bit is set to 16. Thus, a quotient obtained by dividing level value QLdiff of a low-order current difference by the base number is a carry amount to be added to a high-order cell. In a binary logic circuit, division by 16 can be calculated by simple bit-shift computation, and thus can be readily mounted by using a simple logic circuit. Level value Qcarry of a carry amount is obtained by:

Qcarry=QLdiff/16 (that is integer division with the fractional part being discarded)

In the description, since comparison of low-order total current shows that the current on the negative side is higher, negative-side carry control circuit C24 that controls negative-side additional region PCNUs selects cells corresponding to level value Qcarry.

Finally, as shown by operation phase Step 3 that is the third phase in the flowchart in FIG. 14, high-order readout determination circuit C4 compares positive-side high-order total current and negative-side high-order total current in a state in which the carry amount in operation phase Step 2 is connected, and the result of the comparison determination obtained by high-order readout determination circuit C4 is made a final output. When the high-order comparison shows that the total current is the same, the result of low-order comparison is made a final output. This processing corresponds to a process of outputting a computation result for selection of a word line in the main region by using the second control circuit, the fourth control circuit, and the first determination circuit.

Thus, as shown by operation in operation phase Step 2, in a state in which negative-side additional region PCNUs adds an appropriate carry amount in parallel to high-order cells as cell current, word-line selection circuit C1 selects a word line corresponding to an input vector for the neural network, and high-order readout determination circuit C4 executes readout. As a final output result, a comparison determination result of high-order readout determination circuit C4 is adopted, yet if high-order comparison is difficult, a comparison result obtained by lower-order readout determination circuit C3 is made a final output.

Note that although description so far shows the readout determination circuits determine that input is equal, normally in current comparison determination in which a differential current sense amplifier, for instance, is used, it is typical to output logical value 0 or 1 according to the magnitude of the input. For input with current that is equal or has a very small difference, it is well known that an output undefined region referred to as a dead zone is present, and it is not general to expect an operation of determining whether input is identical as a comparison function of a differential sense amplifier. However, in the case of the present embodiment to compare current in a quantized state, a known evaluation technique for determining, as equality determination, whether a difference in input is sufficiently close to 0 as compared to resolution at a quantization level can be used to make such determination, by using a method such as margin lead that corresponds to machine epsilon to see if a result changes by a load of about Iunit*0.5, for example, being additionally given.

By using the neural network computation circuit and the operation method as described above, cell current per quantization unit can be ensured while reducing total current of a multiply-accumulate operation by a current adding method on a bit line.

As described above, a computation circuit unit according to the present embodiment is a computation circuit unit that holds a weight coefficient having a positive value or a negative value and corresponding to input data that selectively takes on a first logical value or a second logical value, and provides current corresponding to a product of the input data and the weight coefficient, the computation circuit unit including: a word line; a first data line; a second data line; a third data line; a fourth data line; a fifth data line; a sixth data line; a seventh data line; an eighth data line; a first nonvolatile semiconductor storage element; a second nonvolatile semiconductor storage element; a third nonvolatile semiconductor storage element; a fourth nonvolatile semiconductor storage element; a first selection transistor; a second selection transistor; a third selection transistor; and a fourth selection transistor. A gate of the first selection transistor, a gate of the second selection transistor, a gate of the third selection transistor, and a gate of the fourth selection transistor are connected to the word line, one terminal of the first nonvolatile semiconductor storage element and a drain terminal of the first selection transistor are connected, one terminal of the second nonvolatile semiconductor storage element and a drain terminal of the second selection transistor are connected, one terminal of the third nonvolatile semiconductor storage element and a drain terminal of the third selection transistor are connected, one terminal of the fourth nonvolatile semiconductor storage element and a drain terminal of the fourth selection transistor are connected, the first data line and a source terminal of the first selection transistor are connected, the third data line and a source terminal of the second selection transistor are connected, the fifth data line and a source terminal of the third selection transistor are connected, the seventh data line and a source terminal of the fourth selection transistor are connected, the second data line and an other terminal of the first nonvolatile semiconductor storage element are connected, the fourth data line and an other terminal of the second nonvolatile semiconductor storage element are connected, the sixth data line and an other terminal of the third nonvolatile semiconductor storage element are connected, the eighth data line and an other terminal of the fourth nonvolatile semiconductor storage element are connected, the first nonvolatile semiconductor storage element holds, as a resistance value, information of a positive weight coefficient with a weight different from a weight for the second nonvolatile semiconductor storage element, the third nonvolatile semiconductor storage element holds, as a resistance value, information of a negative weight coefficient with a weight different from a weight for the fourth nonvolatile semiconductor storage element, and by the first data line, the third data line, the fifth data line, and the seventh data line being grounded and the second data line, the fourth data line, the sixth data line, and the eighth data line each being applied with a voltage, the computation circuit unit provides, based on current flowing through the second data line, the fourth data line, the sixth data line, and the eighth data line, (i) current corresponding to the product obtained from the input data having the first logical value when the word line is non-selected, and (ii) current corresponding to the product obtained from the input data having the second logical value when the word line is selected.

Accordingly, a positive weight coefficient is expressed using two nonvolatile semiconductor storage elements having different weights and a negative weight coefficient is expressed using two nonvolatile semiconductor storage elements having different weights. Hence, both of maintaining current accuracy and reduction in total current in multiply-accumulate operations, which are antinomic issues, can be achieved. Thus, a neural network computation circuit that includes nonvolatile semiconductor storage elements that can achieve reduction in power consumption and large-scale integration can be provided.

More specifically, the first nonvolatile semiconductor storage element holds information of an upper digit of an absolute value of the positive weight coefficient, the second nonvolatile semiconductor storage element holds information of a lower digit of the absolute value of the positive weight coefficient, the third nonvolatile semiconductor storage element holds information of an upper digit of an absolute value of the negative weight coefficient, and the fourth nonvolatile semiconductor storage element holds information of a lower digit of the absolute value of the negative weight coefficient. Accordingly, both of the positive weight coefficient and the negative weight coefficient can be expressed by two bits.

Note that each of the first nonvolatile semiconductor storage element, the second nonvolatile semiconductor storage element, the third nonvolatile semiconductor storage element, and the fourth nonvolatile semiconductor storage element may be a variable resistance storage element, a phase-change storage element, a field effect transistor element, or a resistance element having a predetermined fixed resistance value. Accordingly, a computation circuit unit that includes various types of nonvolatile semiconductor storage elements can be provided.

The neural network computation circuit according to the embodiment is a neural network computation circuit including: a main region that includes a plurality of computation circuit units each of which is the computation circuit unit; a first additional region, a second additional region, a third additional region, and a fourth additional region each of which includes a selection transistor and a nonvolatile semiconductor storage element having a structure identical to a structure of the first to fourth nonvolatile semiconductor storage elements included in each of the plurality of computation circuit units; a first control circuit for selecting a word line to be connected to a gate of the selection transistor included in the first additional region; a second control circuit for selecting a word line to be connected to a gate of the selection transistor included in the second additional region; a third control circuit for selecting a word line to be connected to a gate of the selection transistor included in the third additional region; a fourth control circuit for selecting a word line to be connected to a gate of the selection transistor included in the fourth additional region; a first node; a second node; a third node; a fourth node; a fifth node; a sixth node; a seventh node; an eighth node; a first determination circuit; and a second determination circuit. The first data line included in each of the plurality of computation circuit units in the main region is connected to the first node, the second data line included in each of the plurality of computation circuit units in the main region is connected to the second node, the third data line included in each of the plurality of computation circuit units in the main region is connected to the third node, the fourth data line included in each of the plurality of computation circuit units in the main region is connected to the fourth node, the fifth data line included in each of the plurality of computation circuit units in the main region is connected to the fifth node, the sixth data line included in each of the plurality of computation circuit units in the main region is connected to the sixth node, the seventh data line included in each of the plurality of computation circuit units in the main region is connected to the seventh node, the eighth data line included in each of the plurality of computation circuit units in the main region is connected to the eighth node, the first determination circuit is connected to the second node and the sixth node, the second determination circuit is connected to the fourth node and the eighth node, the first control circuit is connected to a word line in the first additional region, the second control circuit is connected to a word line in the second additional region, the third control circuit is connected to a word line in the third additional region, the fourth control circuit is connected to a word line in the fourth additional region, each of a plurality of word lines in the main region receives input of corresponding binary data, by the third node and the seventh node being grounded and the fourth node and the eighth node each being applied with a voltage, the neural network computation circuit determines, based on current flowing through the fourth node and the eighth node, a low-order computation result by controlling the first control circuit, the third control circuit, and the second determination circuit, and the neural network computation circuit: determines control of the second control circuit and the fourth control circuit, based on the low-order computation result; and outputs, using the first determination circuit, a computation result corresponding to a sum of products, by the first node and the fifth node being grounded and the second node and the sixth node each being applied with a voltage, the products being obtained by the plurality of computation circuit units.

Accordingly, a neural network computation circuit that includes a plurality of computation circuit units that can achieve both of maintaining current accuracy and reduction in total current in multiply-accumulate operations can be provided. Thus, a neural network computation circuit that includes nonvolatile semiconductor storage elements that can achieve reduction in power consumption and large-scale integration can be provided.

Here, the first control circuit, the second control circuit, the third control circuit, and the fourth control circuit cause the first additional region, the second additional region, the third additional region, and the fourth additional region to pass current having a predetermined current amount to the first node, the third node, the fifth node, and the seventh node, respectively. Accordingly, a difference between the positive weight coefficient and the negative weight coefficient can be calculated, and a carry from a lower digit to an upper digit can be appropriately processed.

An allowable current amount of current flowing through each of the first node, the second node, the third node, the fourth node, the fifth node, the sixth node, the seventh node, and the eighth node is determined to prevent total current flowing through the plurality of computation circuit units included in the main region from deteriorating linearity of a sum of current flowing through each of the plurality of computation circuit units. Accordingly, linearity of total current can be ensured.

Based on output results from the first determination circuit and the second determination circuit, the first control circuit, the second control circuit, the third control circuit, and the fourth control circuit determine, by linear search or binary search, a predetermined current amount that causes current flowing through the second node and current flowing through the sixth node to have an identical current amount, and a predetermined current amount that causes current flowing through the fourth node and current flowing through the eighth node to have an identical current amount, the second node and the sixth node being connected to the first determination circuit, the fourth node and the eighth node being connected to the second determination circuit. Accordingly, the carry amounts from the lower digit to the upper digit of the positive weight coefficient and the negative weight coefficient can be calculated for a short time.

A method for driving a neural network computation circuit according to the present embodiment is a method for driving a neural network computation circuit, the method including: normalizing absolute values of weight coefficients of a plurality of computation circuit units included in the neural network computation circuit, by dividing the absolute values by a maximum value of the weight coefficients; quantizing, based on a bit count, each of the weight coefficients normalized; separating quantized information into one or more high-order bits and one or more low-order bits; and determining, according to the one or more high-order bits and the one or more low-order bits into which the quantized information is separated, a current amount of current flowing through a nonvolatile semiconductor storage element corresponding to a high-order bit among the one or more high-order bits and a current amount of current flowing through a nonvolatile semiconductor storage element corresponding to a low-order bit among the one or more low-order bits, the nonvolatile semiconductor storage element corresponding to the high-order bit and the nonvolatile semiconductor storage element corresponding to the low-order bit being included in each of the plurality of computation circuit units.

Accordingly, a weight coefficient is normalized and thereafter is separated into a high-order bit and a low-order bit and the amounts of current corresponding to the high-order bit and the low-order bit are determined. Thus, a neural network computation circuit that can achieve both of maintaining current accuracy and reduction in total current in multiply-accumulate operations, which are antinomic issues with conventional technology, can be provided.

The method for driving the neural network computation circuit according to the present embodiment includes: selecting one of the plurality of word lines in the main region for an input signal to the neural network computation circuit; determining the low-order computation result by controlling the first control circuit, the third control circuit, and the second determination circuit, based on the current flowing through the fourth node and the eighth node; determining the control of the second control circuit and the fourth control circuit, based on the low-order computation result; and outputting a computation result for selecting the one of the plurality of word lines in the main region, the computation result being obtained using the second control circuit, the fourth control circuit, and the first determination circuit.

Accordingly, a difference between the positive weight coefficient and the negative weight coefficient for a lower digit is conveyed to an upper digit. Finally, the magnitude between the positive weight coefficient and the negative weight coefficient for which the upper digit and the lower digit are taken into consideration is determined, and output of an activation function in a neuron can be obtained.

Embodiment 2

Embodiment 1 has shown a configuration of performing one multiply-accumulate operation. Embodiment 2 is an embodiment for embodying, with use of a neural network computation circuit according to the present disclosure, a neural network that performs a plurality of multiply-accumulate operations. In order to describe such an embodiment, first, a relation between a structure of a neural network and the neural network computation circuit according to the present disclosure is to be further clarified.

Figure 19:
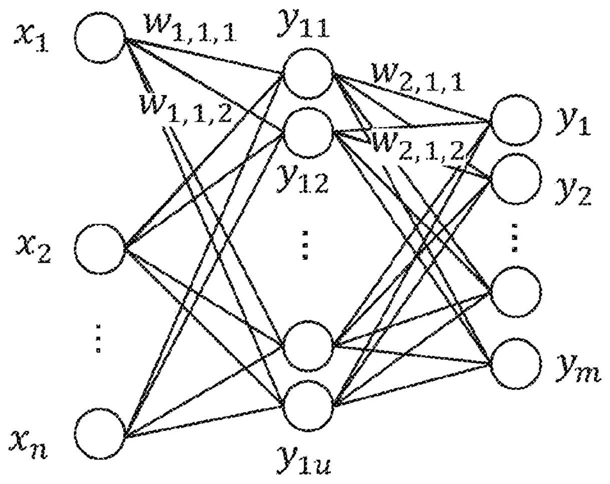
FIG. 19 is a diagram for explaining a schematic diagram of a typical neural network calculation model.

FIG. 19 is a diagram for explaining a schematic diagram of a typical neural network calculation model. More specifically, (a) of FIG. 19 is a schematic diagram of a typical neural network calculation model, (b) of FIG. 19 shows explanation of symbols in (a) of FIG. 19, and (c) of FIG. 19 shows an equation for explaining activation function f. As illustrated in FIG. 19, normally, in a neural network calculation model, a process of multiplying an input vector that includes a plurality of input values by a matrix and performing activation function f on the values of the outputs is considered as one unit, which is referred to as a layer. A neural network that is actually used in inference, for instance, can approximate a more complicated multiple output function than a conventional linear approximation model by using a multi-layer structure in which such layers are connected, and is applied to a classification task, for instance, by utilizing the outputs.

Embodiment 1 is an embodiment for performing one multiply-accumulate operation, yet considering the configuration of the above neural network for actual use, the entire operation can be performed at higher speed by parallelizing multiply-accumulate operations in the same layer. An embodiment that may be adopted therefor is to be described next.

Figure 20:
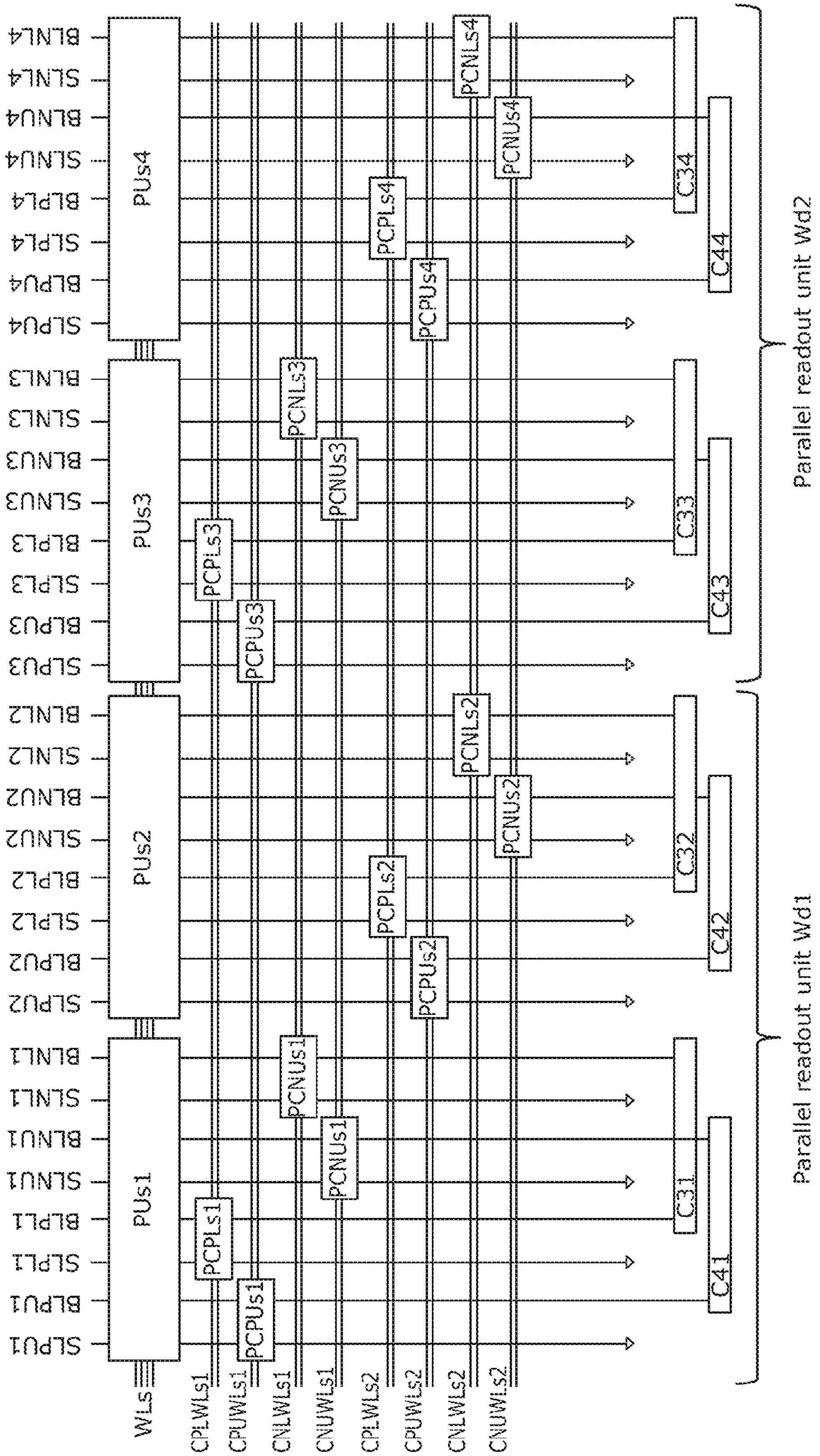
FIG. 20 illustrates a configuration of a parallelized neural network circuit according to Embodiment 2.

FIG. 20 is a block diagram as an example of parallelization. Thus, FIG. 20 illustrates a configuration of a parallelized neural network circuit according to Embodiment 2. PUs1, . . . , PUs4 in FIG. 20 represent main regions that hold weight coefficients. The configurations of PUs1, . . . , PUs4 and additional regions accompanied therewith are the same as the configuration of PUs in FIG. 1. For convenience, a configuration for readout using two parallels is to be described with reference to FIG. 20, yet the same configuration can also be adopted also in the case where the number of parallels is increased.

In a readout operation using two parallels, a basic unit in each of parallel readout units or output therefrom is referred to as a bit. In FIG. 20, the first bit of parallel readout unit Wd1 corresponds to PUs1, and PUs2 corresponds to the second bit. In next parallel readout unit Wd2, PUs3 corresponds to the first bit, and PUs4 corresponds to the second bit.

Additional regions PCPUs, PCPLs, PCNUs, and PCNLs and word line groups CPUWLs, CPLWLs, CNUWLs, and CNLWLs for controlling the additional regions are to be independently controlled on a bit-by-bit basis in a parallel readout unit. On the other hand, additional regions and word line groups are not affected in different parallel readout units, and thus can be shared. Considering these, as illustrated in FIG. 20, an additional region is to be connected to a different word line address for each parallel bit. Hence, additional regions PCPUs1, PCPLs1, PCNUs1, PCNLs1, PCPUs2, PCPLs2, PCNUs2, and PCNLs2 are controlled by different word line groups CPUWLs1, CPLWLs1, CNUWLs1, CNLWLs1, CPUWLs2, CPLWLs2, CNUWLs2, and CNLWLs2, respectively. On the other hand, the additional regions of PUs1 that is the first bit of parallel readout unit Wd1 and the additional regions of PUs3 that is the first bit of parallel readout unit Wd2 can be controlled by common word line groups. Thus, additional regions PCPUs1, PCPLs1, PCNUs1, PCNLs1, PCPUs3, PCPLs3, PCNUs3, and PCNLs3 are controlled by same word line groups CPUWLs1, CPLWLs1, CNUWLs1, and CNLWLs1, respectively. With such a configuration, a plurality of outputs can be read out in parallel without impairing functionality of a computation unit of a neural network provided in Embodiment 1.

As a method often used as a typical technique for designing a memory array, there is a method of adopting an architecture in which a circuit used for reading out and writing in is shared, and when reading out or writing in, the circuit is connected to a bit line or a source line that is to be accessed using a column selector. From such a viewpoint, a circuit and a configuration that relate to reading out can be shared also in the present embodiment.

Figure 21:
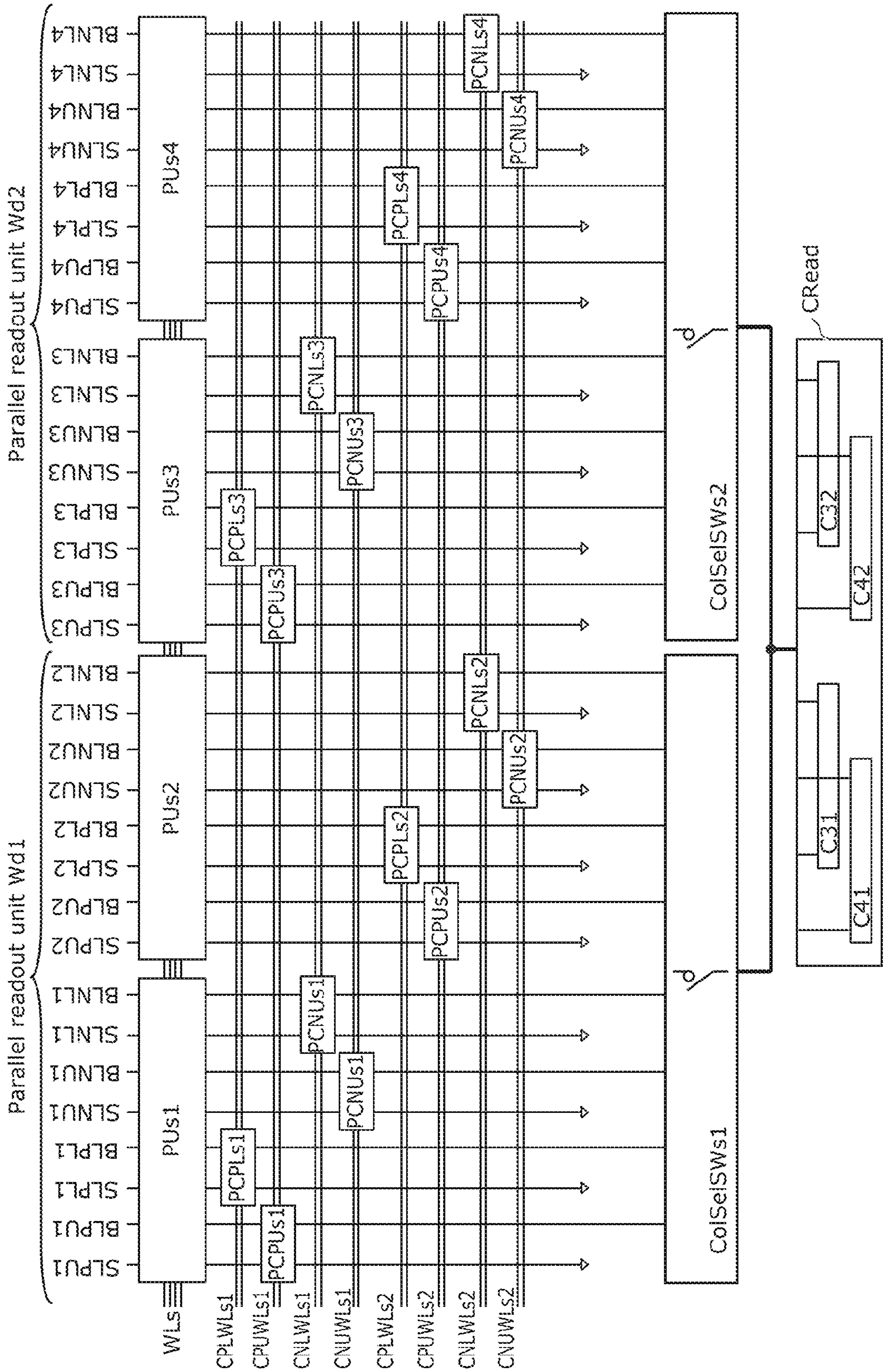
FIG. 21 illustrates a configuration in which only readout determination circuits are shared in the parallelized neural network circuit according to Embodiment 2.
Figure 22:
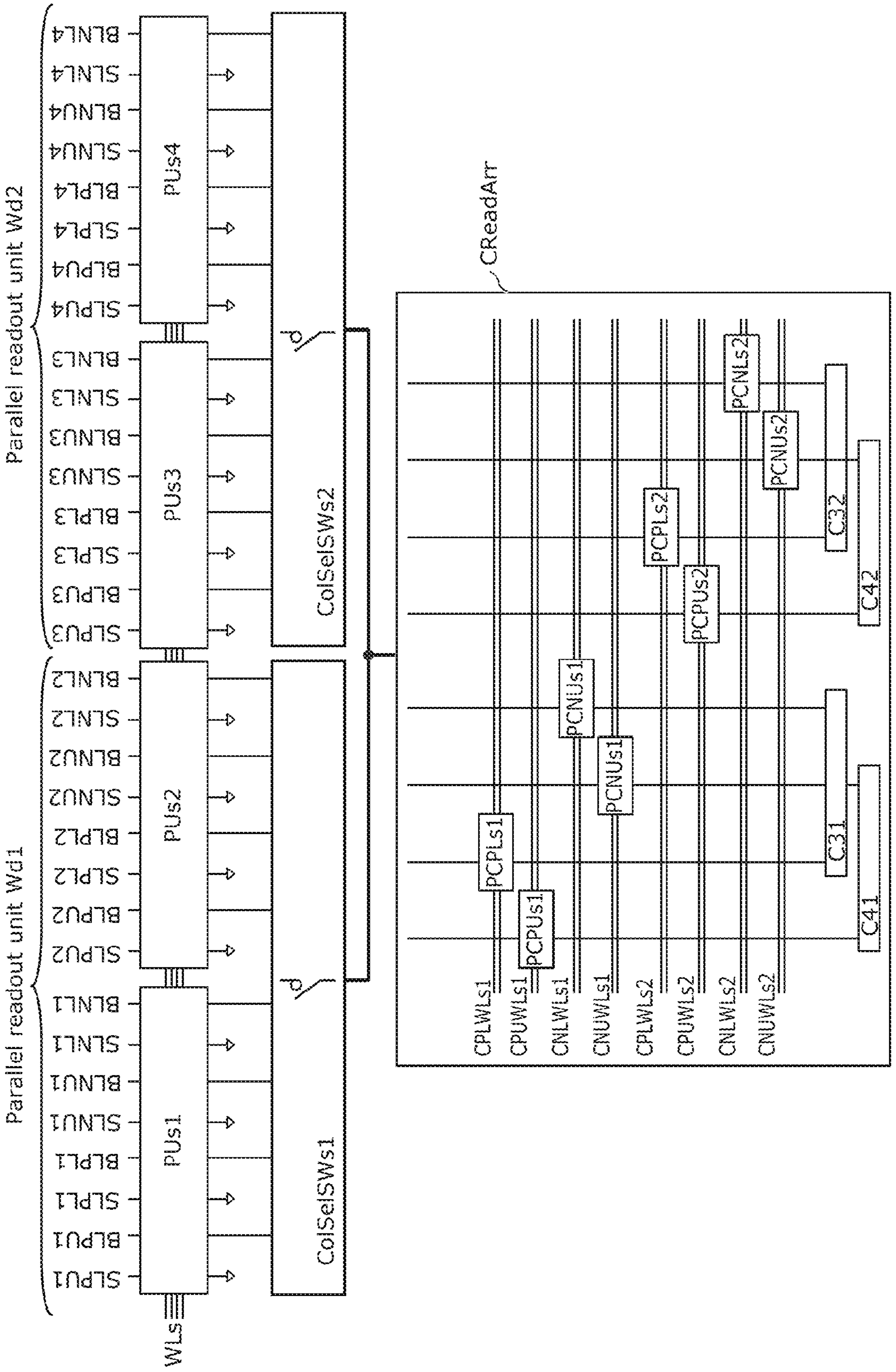
FIG. 22 illustrates a configuration in which additional regions and the readout determination circuits are shared in the parallelized neural network circuit according to Embodiment 2.

FIG. 21 illustrates the case where only the determination circuits are shared, and FIG. 22 illustrates an example of a configuration when the determination circuits and also additional regions are shared. Stated differently, FIG. 21 illustrates a configuration in which only the readout determination circuits are shared in the parallelized neural network circuit according to Embodiment 2. Here, the main regions and the additional regions in parallel readout unit Wd1 and parallel readout unit Wd2 are connected to shared readout determination circuit CRead via selection switch blocks ColSelSWs1 and ColSelSWs1 each of which includes a plurality of selection switches. FIG. 22 illustrates a configuration in which the additional regions and the readout determination circuits are shared in the parallelized neural network circuit according to Embodiment 2. Here, the main regions in parallel readout unit Wd1 and parallel readout unit Wd2 are connected to readout determination circuit CReadArr that includes shared additional regions via selection switch blocks ColSelSWs1 and ColSelSWs1 each of which includes a plurality of selection switches.

These yield effects of reducing space, but may raise design related issues such as variations in length of paths from cells to the readout determination circuits due to the layout arrangement and an increase in resistance component of a selection switch, and thus a configuration is to be determined comprehensively, taking these into consideration when designing circuits.

Embodiment 3

In Embodiment 1, a computation circuit unit for expressing one weight coefficient divides the weight coefficient into two cells for each sign of the weight, and halves the bit-count load at a weight quantization level, whereby a neural network computation circuit that achieves both reduction in cell current and maintaining computation accuracy. Yet, a weight coefficient can be divided into more cells. Embodiment 3 is to show this.

Figure 23:
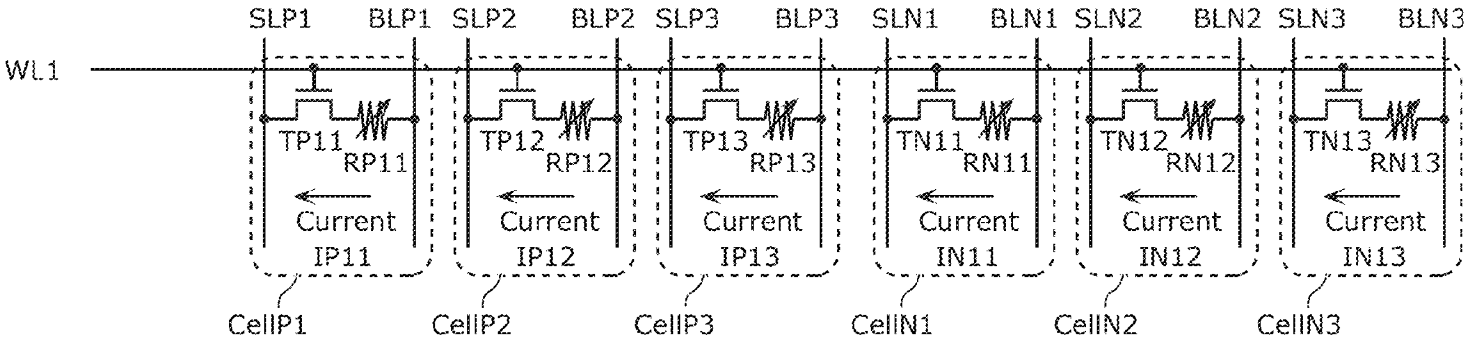
FIG. 23 illustrates a configuration of a computation circuit unit that expresses a weight coefficient using six cells, according to Embodiment 3.

FIG. 23 is a diagram for explaining a configuration of a computation circuit unit that expresses a weight coefficient using six cells, according to Embodiment 3. More specifically, (a) of FIG. 23 illustrates a configuration of a computation circuit unit that expresses a weight coefficient using six cells, whereas (b) of FIG. 23 illustrates cell setting conditions in (a) of FIG. 23. As illustrated in (a) of FIG. 23, in addition to the configuration illustrated in FIG. 11A, the computation circuit unit according to the present embodiment further includes a fifth nonvolatile semiconductor storage element (nonvolatile variable resistance element RP21) that holds, as a resistance value, information of a positive weight coefficient with a weight different from those for the first nonvolatile semiconductor storage element (nonvolatile variable resistance element RP11) and the second nonvolatile semiconductor storage element (nonvolatile variable resistance element RP31), and a sixth nonvolatile semiconductor storage element (nonvolatile variable resistance element RN21) that holds, as a resistance value, information of a negative weight coefficient with a weight different from those for the third nonvolatile semiconductor storage element (nonvolatile variable resistance element RN11) and the fourth nonvolatile semiconductor storage element (nonvolatile variable resistance element RN31).

More specifically, (a) of FIG. 23 illustrates a configuration of one computation circuit unit when three cells are used for each sign in expressing one weight coefficient. Similarly to Embodiment 1, by reducing cell-current upper limit Imax to one third of settable cell-current upper limit Imax0 that is original current performance of an element, and then seven bits for expressing an absolute value of a weight are divided by three cells in the present embodiment. Thus, considering CellP1 is a most significant bit (MSB), CellP2 is a second bit, and CellP3 is a least significant bit (LSB), these bits are each quantized based on a quantization bit count of three bits. In particular, a base of a carry is 2^=8. Here, ^represents a power of a number. By dividing in this manner, as illustrated in (b) of FIG. 23, higher current of Imax0/3/7 can be ensured for cell current per quantization unit.

Accordingly, by dividing a quantization bit count, cell current can be increased per quantization unit, but nevertheless the number of elements to be provided also increases in proportion to the division count. Hence, an appropriate division count is to be determined under such constraints when designing. Normally, quantization bit count B, decrease rate R for cell-current upper limit Imax, and division count m are used, change rate Runit of cell current per quantization unit is:

$$Runit = R\times(2^\wedge B-1)/(2^\wedge(B/m)-1)$$

Here, B/m is rounded up and an integer value is obtained.

Figure 24:
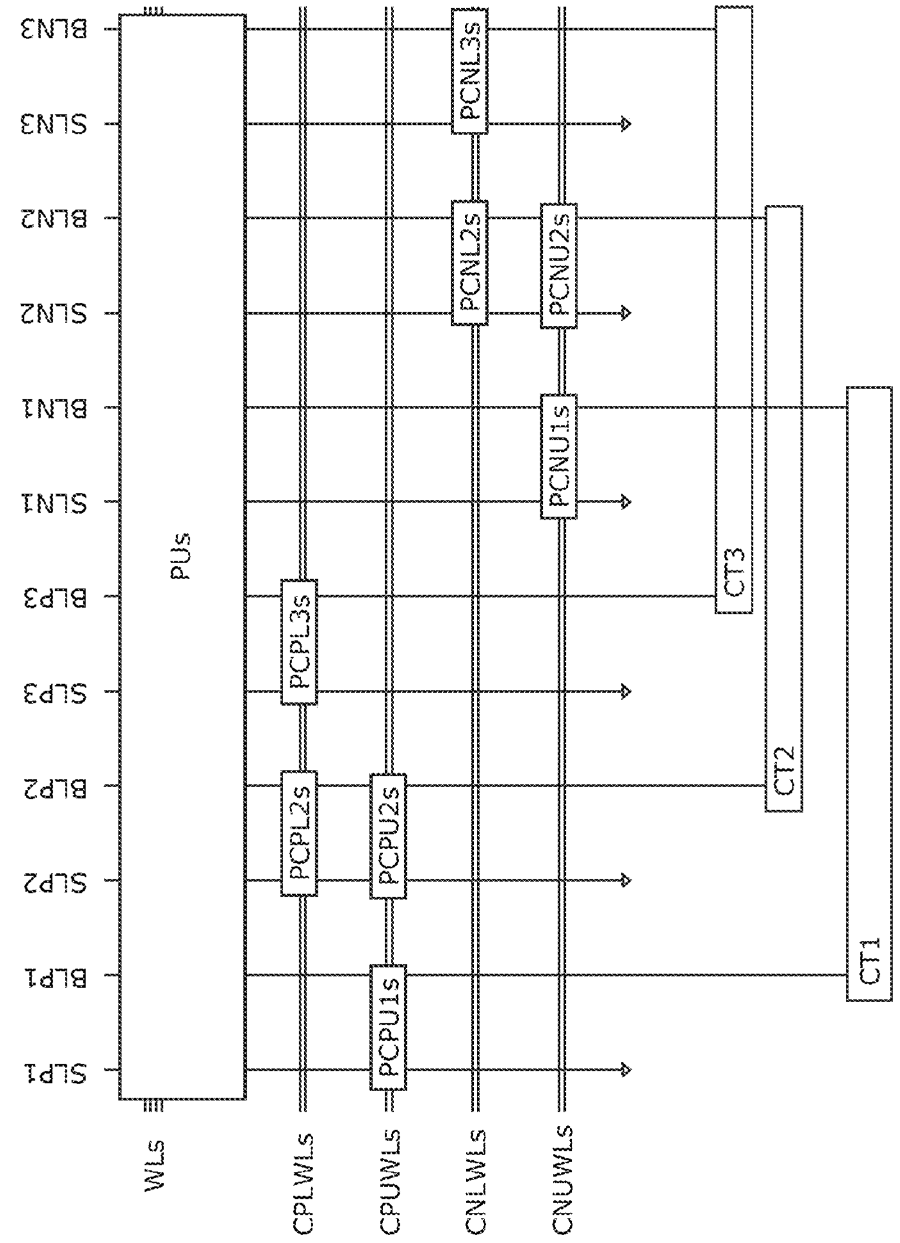
FIG. 24 illustrates a configuration of a neural network computation circuit that includes computation circuit units that each express a weight coefficient using six cells, according to Embodiment 3.

An example of a configuration of a neural network computation circuit that adopts Embodiment 3 is to be described with reference to FIG. 24. FIG. 24 illustrates a configuration of a neural network computation circuit that includes computation circuit units that each express a weight coefficient using six cells, according to Embodiment 3. In FIG. 24, PUs represents a main region, and a plurality of computation circuit units that each use six cells according to Embodiment 3 are disposed. Bit lines BLP1, BLP2, BLP3, BLN1, BLN2, and BLN3 and source lines SLP1, SLP2, SLP3, SLN1, SLN2, and SLN3 are appropriately connected to bits in the computation circuit units in PUs. Hence, for example, bit line BLP1 and source line SLP1 are connected to a positive most significant bit among the six cells in each computation circuit unit, and bit line BLN3 and source line SLN3 are connected to a negative least significant bit among the six cells in each computation circuit unit.

A multiply-accumulate operation is to be performed for each bit, similarly to Embodiment 1. Thus, operations of m steps are to be performed for division count m. Similarly to Embodiment 1, except computation of the most significant bit, a carry amount is to be calculated at a level count. Connection of additional regions PCPLs3, PCPLs2, PCNLs3, and PCNLs2 is controlled by operating CPLWLs and CNLWLs, and a level at which determination is switched is determined using readout determination circuits CT3 and CT2. This method is the same as in Embodiment 1, and details are omitted. Also with regard to a carry, similarly to Embodiment 1, a quantization level count corresponding to the carry calculated in the previous phase is divided by the base of bit expression, to determine an amount of additional current to be added to a high-order cell by a carry.

Here, as a difference from Embodiment 1, a multiply-accumulate operation for bits except the most significant bit and the least significant bit is supplementarily described. For each of such bits, a carry amount to the bit itself from a low order is to be considered in calculation of a carry amount from the bit itself to the high order. Hence, a current amount that is a carry amount from the low order is added to the current amount added on a bit line of the bit, and then a carry amount from the bit itself to a high order is calculated. However, such operation can be performed with the configuration illustrated in FIG. 24. For example, as a result of calculation of the least significant bit, when a current amount of a carry is added to the second bit on the positive side, control for holding the carry amount is added to bit line BLP2 by CPUWLs and additional region PCPU2*s*. In this state, results of multiply-accumulate operations for the second bits for positive and negative sides are compared. To calculate the difference, switch of output from readout determination circuit CT2 is determined based on control of CPLWLs and CNLWLs and connection of additional regions PCPL2*s* and PCNL2*s* thereby, yet according to the configuration of the present embodiment, a process of calculating such a difference is separated from PCPU2*s* that holds a carry amount from a low order. Thus, a carry amount to a high order can be calculated in a state in which a carry amount from a low order is added. After that, calculation up to the most significant bit can be completed by repeating the same operation on a high-order bit.

As a final output of the result of a multiply-accumulate operation as a neural network computation circuit, a comparison result of high-order cells is preferentially adopted, and if the comparison result of the high-order cells shows that the computation results are the same, a comparison result of next low-order cells is adopted, similarly to Embodiment 1.

As described above, in addition to the configuration of the first to fourth nonvolatile semiconductor storage elements illustrated in FIG. 11A, the computation circuit unit according to the present embodiment further includes a fifth nonvolatile semiconductor storage element that holds, as a resistance value, information of a positive weight coefficient with a weight different from those for the first nonvolatile semiconductor storage element and the second nonvolatile semiconductor storage element, and a sixth nonvolatile semiconductor storage element that holds, as a resistance value, information of a negative weight coefficient with a weight different from those for the third nonvolatile semiconductor storage element and the fourth nonvolatile semiconductor storage element.

Accordingly, a computation circuit unit is configured of six cells, and a positive weight coefficient and a negative weight coefficient are expressed using three digits, and thus a neural network computation circuit that handles a weight coefficient having a higher quantization level can be obtained.

Embodiment 4

In Embodiment 1, two operation phases are to be performed to read out a result of a multiply-accumulate operation, whereas a method for finishing computation in one phase by readily making determination is to be described as Embodiment 4.

Normally, a network configuration of a neural network and a distribution of values used for weight coefficients, in particular, vary depending on their usages and scales, yet in a practical network, optimization and a training method for making the distribution sparse are well studied. With regard to the weight coefficients in the sparse distribution, many weights are considered to be 0, and a small number of weight coefficients have meaningful values. In such cases, it is considered to be highly probabilistic that results of multiply-accumulate operations also concentrate around 0 or are positioned at values distant from 0 to a certain degree.

Figure 25:
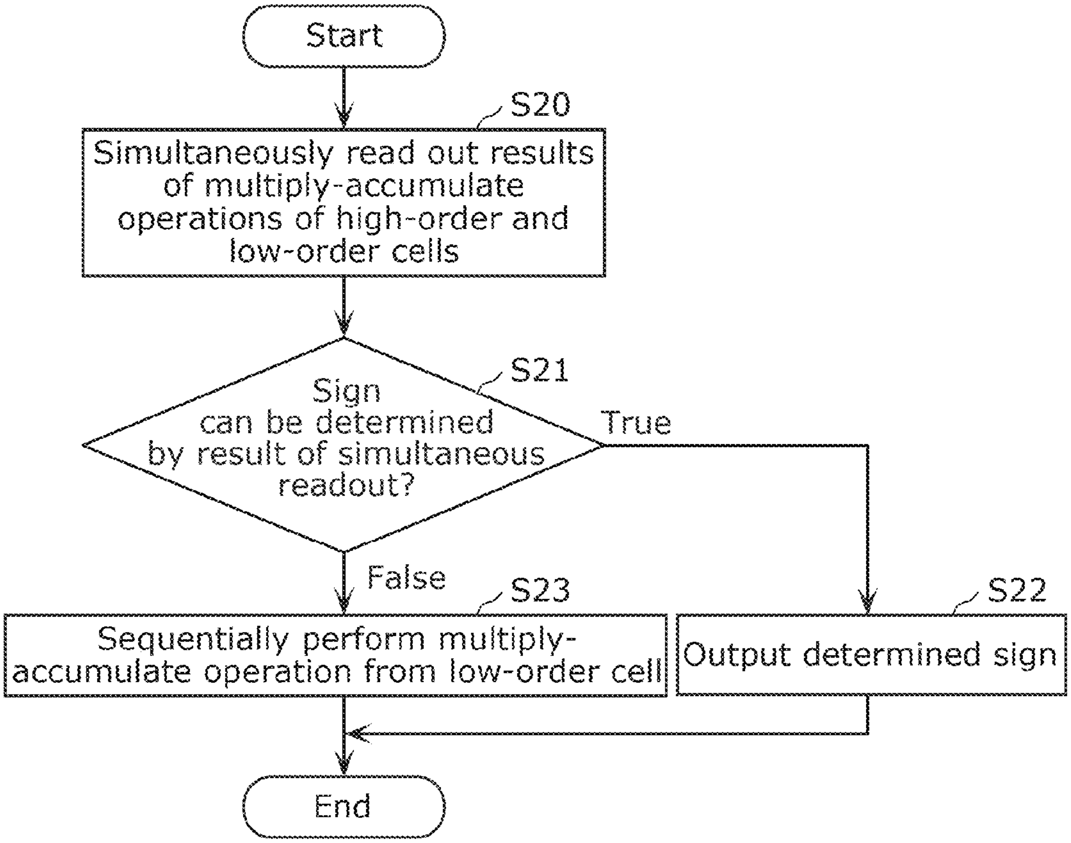
FIG. 25 is a flowchart showing readout by simultaneously reading out from high-order cells and low-order cells, according to Embodiment 4.

FIG. 25 illustrates an operation algorithm that includes simple determination by one-phase readout. Thus, FIG. 25 is a flowchart showing readout by simultaneously reading out from high-order cells and low-order cells, according to Embodiment 4. The configuration in FIG. 1 allows collectively reading out from high-order cells and low-order cells (S20). At this time, high-order readout determination circuit C4 and low-order readout determination circuit C3 output results of magnitude determination for each digit without considering a carry amount from a low-order cell. These are limited combinations, and there are cases where a final magnitude comparing determination can be made without considering a carry. Thus, whether or not a sign can be determined based on results of multiply-accumulate operations simultaneously read out (S21), and in the case where the sign can be determined (True in S21), computation can be finished without considering a carry by outputting the determined sign (S22). Note that in the case where the sign cannot be determined (False in S21), a multiply-accumulate operation is sequentially performed from a low-order cell, similarly to the above embodiment (S23). By using such a pruning method, part of the calculation is simplified, and power can be saved for the entire computation.

FIG. 26 illustrates combinations with which final results can be determined based on a result of high-order readout and a result of low-order readout. FIG. 26 illustrates a table showing output determinability in simultaneous readout from a high-order cell and a low-order cell, according to Embodiment 4. As illustrated in this drawing, when both of high-order readout determination circuit C4 and low-order readout determination circuit C3 determine that positive-side total current IsumP is higher than negative-side total current IsumN, a final output indicating that the sign is positive can be made as a result of a multiply-accumulate operation. Furthermore, when both of high-order readout determination circuit C4 and low-order readout determination circuit C3 determine that negative-side total current IsumN is higher than positive-side total current IsumP, a final output indicating that the sign is negative can be made as a result of a multiply-accumulate operation.

FIG. 27 illustrates combinations when the readout determination circuits have a function of making matching determination as described in Embodiment 1. FIG. 27 illustrates a table showing output determinability in simultaneous readout from a high-order cell and a low-order cell, according to Embodiment 4. The case where determination cannot be made by reading out without considering a carry is a case where the results of determinations by a high-order cell and a low-order cell are different (the case where "Indeterminable" is shown in the "Final output" column in FIG. 27), and this is because a carry from a low-order cell may make a result of high-order determination different from the determination result when a carry is not considered. However, in view of a technical background of making the distribution sparse as described above, a combination of weight coefficients that causes such a case is the case where, for example, significant values are included on both the positive side and the negative side, and results are present near 0 due to cancellation by multiply-accumulate operations. This case is expected to occur less frequently. In many cases, it is expected that final outputs can be determined based on results of determinations by high-order cells and low-order cells.

From the above description, such simplification of operations by pruning, which is shown as Embodiment 4, can increase the speed of operation of the neural network computation circuit.

CONCLUSION

As described above, the neural network computation circuit according to the present disclosure performs a multiply-accumulate operation in a neural network calculation model using a current value of current flowing through nonvolatile semiconductor storage elements. Accordingly, a multiply-accumulate operation can be performed without mounting a multiplication circuit or an accumulation circuit (accumulator circuit) for which conventional digital circuits are used, and thus power consumption of the neural network computation circuit can be reduced and the chip area for the semiconductor integrated circuit can be reduced. In particular, antinomic issues of reduction in cell current and maintaining calculation accuracy with conventional technology can be addressed by calculation divided among a plurality of cells. Hence, it is possible to provide further various neural network models with ways to achieve their functionality.

The above has described embodiments of the present disclosure, yet the neural network computation circuit that includes nonvolatile semiconductor storage elements according to the present disclosure is not limited only to the examples described above, and is effective to circuits resulting from applying various changes within a range that does not depart from the gist of the present disclosure.

For example, the neural network computation circuit that includes nonvolatile semiconductor storage elements according to the above embodiments is an example that includes a variable resistance nonvolatile memory (resistive random access memory (ReRAM)). Yet, the present disclosure is applicable to the case where a phase-change storage element (PRAM), a variable-resistance nonvolatile resistance element such as flash memory, or a variable current element in which a nonvolatile semiconductor storage element other than those is indirectly used.

Figure 28:
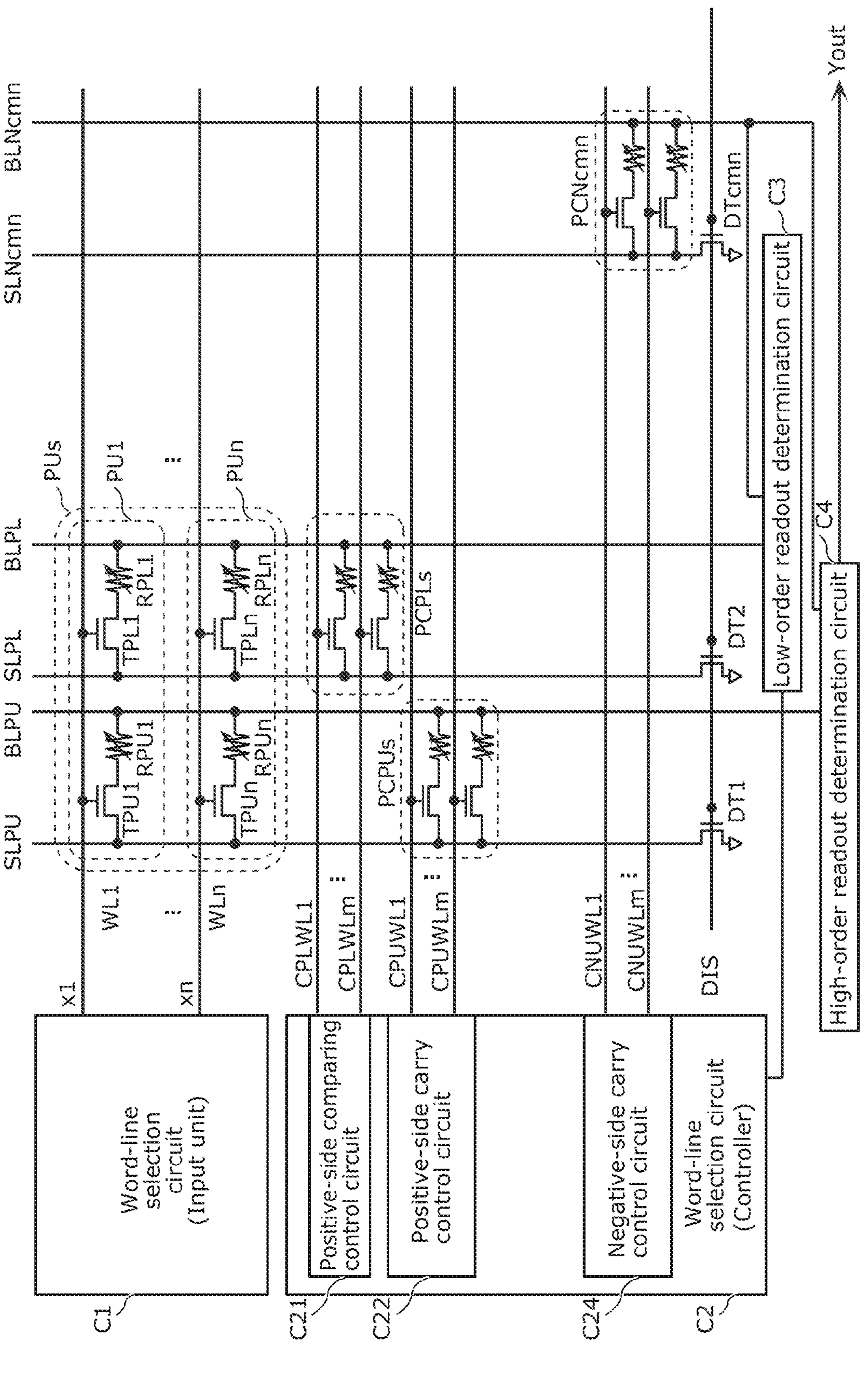
FIG. 28 illustrates a configuration of a neural network computation circuit that handles weight coefficients without signs, according to a variation of Embodiment 1.

When the neural network computation circuit according to the present disclosure is regarded as a multiply-accumulate operation circuit, although the detailed description of the embodiments relates to integers having signs resulting from quantizing real numbers with signs. But it is possible to take out only functions for computation without signs, for example. At that time, as illustrated in FIG. 28, for example, it is conceivable to adopt a configuration in which inputs on the negative side are assumed to be always 0. FIG. 28 illustrates a configuration of a neural network computation circuit that handles weight coefficients without signs, according to a variation of Embodiment 1. With this configuration, it is not necessary to provide as many inputs on the negative side as the bit division count, and the inputs can be shared. The gist of the present disclosure also encompasses such methods.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

A neural network computation circuit that includes nonvolatile semiconductor storage elements according to the present disclosure has a configuration of performing a multiply-accumulate operation using nonvolatile semiconductor storage elements, and thus can perform a multiply-accumulate operation without including a multiplication circuit or an accumulation circuit (accumulator circuit) that includes a conventional digital circuit. Since input data and output data are converted into binary digital data, and thus a large-scale neural network circuit can be readily integrated. Thus, the neural network computation circuit yields effects of reducing power consumption and achieving large-scale integration of a neural network computation circuit, and is useful to, for example, a semiconductor integrated circuit that includes artificial intelligence (AI) technology so as to be trained by themselves and make determinations, and electronic devices that includes such an integrated circuit.

The invention claimed is:

1. A computation circuit unit that holds a weight coefficient having a positive value or a negative value and corresponding to input data that selectively takes on a first logical value or a second logical value, and provides current corresponding to a product of the input data and the weight coefficient, the computation circuit unit comprising:

a word line;

a first data line;

a second data line;

a third data line;

a fourth data line;

a fifth data line;

a sixth data line;

a seventh data line;

an eighth data line;

a first nonvolatile semiconductor storage element;

a second nonvolatile semiconductor storage element;

a third nonvolatile semiconductor storage element;

a fourth nonvolatile semiconductor storage element;

a first selection transistor;

a second selection transistor;

a third selection transistor; and a fourth selection transistor, wherein a gate of the first selection transistor, a gate of the second selection transistor, a gate of the third selection transistor, and a gate of the fourth selection transistor are connected to the word line, one terminal of the first nonvolatile semiconductor storage element and a drain terminal of the first selection transistor are connected, one terminal of the second nonvolatile semiconductor storage element and a drain terminal of the second selection transistor are connected, one terminal of the third nonvolatile semiconductor storage element and a drain terminal of the third selection transistor are connected, one terminal of the fourth nonvolatile semiconductor storage element and a drain terminal of the fourth selection transistor are connected, the first data line and a source terminal of the first selection transistor are connected, the third data line and a source terminal of the second selection transistor are connected, the fifth data line and a source terminal of the third selection transistor are connected, the seventh data line and a source terminal of the fourth selection transistor are connected, the second data line and another terminal of the first nonvolatile semiconductor storage element are connected, the fourth data line and another terminal of the second nonvolatile semiconductor storage element are connected, the sixth data line and another terminal of the third nonvolatile semiconductor storage element are connected, the eighth data line and another terminal of the fourth nonvolatile semiconductor storage element are connected, the first nonvolatile semiconductor storage element holds, as a resistance value, information of a positive weight coefficient with a weight different from a weight for the second nonvolatile semiconductor storage element, the third nonvolatile semiconductor storage element holds, as a resistance value, information of a negative weight coefficient with a weight different from a weight for the fourth nonvolatile semiconductor storage element, by the first data line, the third data line, the fifth data line, and the seventh data line being grounded and the second data line, the fourth data line, the sixth data line, and the eighth data line each being applied with a voltage, the computation circuit unit provides, based on current flowing through the second data line, the fourth data line, the sixth data line, and the eighth data line, (i) current corresponding to the product obtained from the input data having the first logical value when the word line is non-selected, and (ii) current corresponding to the product obtained from the input data having the second logical value when the word line is selected, the first nonvolatile semiconductor storage element holds information of an upper digit of an absolute value of the positive weight coefficient, the second nonvolatile semiconductor storage element holds information of a lower digit of the absolute value of the positive weight coefficient, the third nonvolatile semiconductor storage element holds information of an upper digit of an absolute value of the negative weight coefficient, and the fourth nonvolatile semiconductor storage element holds information of a lower digit of the absolute value of the negative weight coefficient.

2. The computation circuit unit according to claim 1, further comprising:

a fifth nonvolatile semiconductor storage element that holds, as a resistance value, information of the positive weight coefficient with a weight different from the weight for the first nonvolatile semiconductor storage element and the weight for the second nonvolatile semiconductor storage element; and a sixth nonvolatile semiconductor storage element that holds, as a resistance value, information of the negative weight coefficient with a weight different from the weight for the third nonvolatile semiconductor storage element and the weight for the fourth nonvolatile semiconductor storage element.

3. The computation circuit unit according to claim 1, wherein each of the first nonvolatile semiconductor storage element, the second nonvolatile semiconductor storage element, the third nonvolatile semiconductor storage element, and the fourth nonvolatile semiconductor storage element is a variable resistance storage element, a phase-change storage element, a field effect transistor element, or a resistance element having a predetermined fixed resistance value.

4. A neural network computation circuit comprising: a main region that includes a plurality of computation circuit units each of which is a computation circuit unit; the computation circuit unit being configured to hold a weight coefficient having a positive value or a negative value and corresponding to input data that selectively takes on a first logical value or a second logical value, and provides current corresponding to a product of the input data and the weight coefficient, the computation circuit unit comprising:

a word line;

a first data line;

a second data line;

a third data line;

a fourth data line;

a fifth data line;

a sixth data line;

a seventh data line;

an eighth data line;

a first nonvolatile semiconductor storage element;

a second nonvolatile semiconductor storage element;

a third nonvolatile semiconductor storage element;

a fourth nonvolatile semiconductor storage element;

a first selection transistor;

a second selection transistor;

a third selection transistor; and a fourth selection transistor, wherein a gate of the first selection transistor, a gate of the second selection transistor, a gate of the third selection transistor, and a gate of the fourth selection transistor are connected to the word line, one terminal of the first nonvolatile semiconductor storage element and a drain terminal of the first selection transistor are connected, one terminal of the second nonvolatile semiconductor storage element and a drain terminal of the second selection transistor are connected, one terminal of the third nonvolatile semiconductor storage element and a drain terminal of the third selection transistor are connected, one terminal of the fourth nonvolatile semiconductor storage element and a drain terminal of the fourth selection transistor are connected, the first data line and a source terminal of the first selection transistor are connected, the third data line and a source terminal of the second selection transistor are connected, the fifth data line and a source terminal of the third selection transistor are connected, the seventh data line and a source terminal of the fourth selection transistor are connected, the second data line and another terminal of the first nonvolatile semiconductor storage element are connected, the fourth data line and another terminal of the second nonvolatile semiconductor storage element are connected, the sixth data line and another terminal of the third nonvolatile semiconductor storage element are connected, the eighth data line and another terminal of the fourth nonvolatile semiconductor storage element are connected, the first nonvolatile semiconductor storage element holds, as a resistance value, information of a positive weight coefficient with a weight different from a weight for the second nonvolatile semiconductor storage element, the third nonvolatile semiconductor storage element holds, as a resistance value, information of a negative weight coefficient with a weight different from a weight for the fourth nonvolatile semiconductor storage element, and by the first data line, the third data line, the fifth data line, and the seventh data line being grounded and the second data line, the fourth data line, the sixth data line, and the eighth data line each being applied with a voltage, the computation circuit unit provides, based on current flowing through the second data line, the fourth data line, the sixth data line, and the eighth data line, (i) current corresponding to the product obtained from the input data having the first logical value when the word line is non-selected, and (ii) current corresponding to the product obtained from the input data having the second logical value when the word line is selected;

a first additional region and a third additional region each of which includes a selection transistor and a nonvolatile semiconductor storage element having a structure identical to a structure of the first to fourth selection transistors and nonvolatile semiconductor storage elements included in each of the plurality of computation circuit units;

a first control circuit for selecting a first word line to be connected to a gate of the selection transistor included in the first additional region;

a third control circuit for selecting a third word line to be connected to a gate of the selection transistor included in the third additional region;

a third node;

a fourth node;

a seventh node;

an eighth node; and a second determination circuit, wherein the third data line included in each of the plurality of computation circuit units in the main region is connected to the third node, the fourth data line included in each of the plurality of computation circuit units in the main region is connected to the fourth node, the seventh data line included in each of the plurality of computation circuit units in the main region is connected to the seventh node, the eighth data line included in each of the plurality of computation circuit units in the main region is connected to the eighth node, the second determination circuit is connected to the fourth node and the eighth node, the first control circuit is connected to the first word line in the first additional region, the third control circuit is connected to the third word line in the third additional region, each of a plurality of word lines in the main region receives input of corresponding binary data, and by the third node and the seventh node being grounded and the fourth node and the eighth node each being applied with a voltage, the neural network computation circuit determines, based on current flowing through the fourth node and the eighth node, a low-order computation result by controlling the first control circuit, the third control circuit, and the second determination circuit.

5. The neural network computation circuit according to claim 4, wherein the first control circuit and the third control circuit cause the first additional region and the third additional region to pass current having a predetermined current amount to the third node and the seventh node, respectively.

6. The neural network computation circuit according to claim 5, wherein based on an output result from the second determination circuit, the first control circuit and the third control circuit determine, by linear search or binary search, a predetermined current amount that causes current flowing through the fourth node and current flowing through the eighth node to have an identical current amount, the fourth node and the eighth node being connected to the second determination circuit.

7. The neural network computation circuit according to claim 4, wherein an allowable current amount of current flowing through each of the third node, the fourth node, the seventh node, and the eighth node is determined to prevent total current flowing through the plurality of computation circuit units included in the main region from deteriorating linearity of a sum of current flowing through each of the plurality of computation circuit units.

8. The neural network computation circuit according to claim 4, further comprising:

a second additional region and a fourth additional region each of which includes a selection transistor and a nonvolatile semiconductor storage element having a structure identical to the structure of the first to fourth selection transistors and nonvolatile semiconductor storage elements included in the plurality of computation circuit units;

a second control circuit for selecting a second word line to be connected to a gate of the selection transistor included in the second additional region;

a fourth control circuit for selecting a fourth word line to be connected to a gate of the selection transistor included in the fourth additional region;

a first node;

a second node;

a fifth node;

a sixth node; and a first determination circuit, wherein the first data line included in each of the plurality of computation circuit units in the main region is connected to the first node, the second data line included in each of the plurality of computation circuit units in the main region is connected to the second node, the fifth data line included in each of the plurality of computation circuit units in the main region is connected to the fifth node, the sixth data line included in each of the plurality of computation circuit units in the main region is connected to the sixth node, the first determination circuit is connected to the second node and the sixth node, the second control circuit is connected tothe second word line in the second additional region, the fourth control circuit is connected to the fourth word line in the fourth additional region, each of the plurality of word lines in the main region receives input of the corresponding binary data, and the neural network computation circuit:

determines control of the second control circuit and the fourth control circuit, based on the low-order computation result; and outputs, using the first determination circuit, a computation result corresponding to a sum of products, by the first node and the fifth node being grounded and the second node and the sixth node each being applied with a voltage, the products being obtained by the plurality of computation circuit units.

9. The neural network computation circuit according to claim 8, wherein the first control circuit, the second control circuit, the third control circuit, and the fourth control circuit cause the first additional region, the second additional region, the third additional region, and the fourth additional region to pass current having a predetermined current amount to the first node, the third node, the fifth node, and the seventh node, respectively.

10. The neural network computation circuit according to claim 9, wherein based on output results from the first determination circuit and the second determination circuit, the first control circuit, the second control circuit, the third control circuit, and the fourth control circuit determine, by linear search or binary search, a predetermined current amount that causes current flowing through the second node and current flowing through the sixth node to have an identical current amount, and a predetermined current amount that causes current flowing through the fourth node and current flowing through the eighth node to have an identical current amount, the second node and the sixth node being connected to the first determination circuit, the fourth node and the eighth node being connected to the second determination circuit.

11. The neural network computation circuit according to claim 8, wherein an allowable current amount of current flowing through each of the first node, the second node, the third node, the fourth node, the fifth node, the sixth node, the seventh node, and the eighth node is determined to prevent total current flowing through the plurality of computation circuit units included in the main region from deteriorating linearity of a sum of current flowing through each of the plurality of computation circuit units.

12. A method for driving the neural network computation circuit according to claim 8, the method comprising:

selecting one of the plurality of word lines in the main region for an input signal to the neural network computation circuit;

determining the low-order computation result by controlling the first control circuit, the third control circuit, and the second determination circuit, based on the current flowing through the fourth node and the eighth node;

determining the control of the second control circuit and the fourth control circuit, based on the low-order computation result; and outputting a computation result for selecting the one of the plurality of word lines in the main region, the computation result being obtained using the second control circuit, the fourth control circuit, and the first determination circuit.

13. A method for driving a neural network computation circuit, the method comprising:

normalizing absolute values of weight coefficients of a plurality of computation circuit units included in the neural network computation circuit, by dividing the absolute values by a maximum value of the weight coefficients;

quantizing, based on a bit count, each of the weight coefficients normalized;

separating quantized information into one or more high-order bits and one or more low-order bits; and determining, according to the one or more high-order bits and the one or more low-order bits into which the quantized information is separated, a current amount of current flowing through a nonvolatile semiconductor storage element corresponding to a high-order bit among the one or more high-order bits and a current amount of current flowing through a nonvolatile semiconductor storage element corresponding to a low-order bit among the one or more low-order bits, the nonvolatile semiconductor storage element corresponding to the high-order bit and the nonvolatile semiconductor storage element corresponding to the low-order bit being included in each of the plurality of computation circuit units.

* * * * *